United States Patent
Liu

(10) Patent No.: US 9,374,041 B2
(45) Date of Patent: Jun. 21, 2016

(54) DOHERTY POWER AMPLIFICATION APPARATUS AND METHOD

(75) Inventor: Linsheng Liu, Chengdu (CN)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 14/364,266

(22) PCT Filed: Dec. 15, 2011

(86) PCT No.: PCT/CN2011/002109
§ 371 (c)(1),
(2), (4) Date: Jun. 10, 2014

(87) PCT Pub. No.: WO2013/086658
PCT Pub. Date: Jun. 20, 2013

(65) Prior Publication Data
US 2014/0320214 A1    Oct. 30, 2014

(51) Int. Cl.
H03F 1/02    (2006.01)
H03F 3/21    (2006.01)
H03F 3/68    (2006.01)
(Continued)

(52) U.S. Cl.
CPC .............. H03F 1/0288 (2013.01); H03F 1/56 (2013.01); H03F 3/211 (2013.01); H03F 3/602 (2013.01); H03F 3/68 (2013.01); H03F 2200/222 (2013.01); H03F 2200/336 (2013.01); H03F 2200/387 (2013.01); H03F 2200/456 (2013.01)

(58) Field of Classification Search
USPC .................. 330/295, 124 R, 53, 84, 286
See application file for complete search history.

(56) References Cited

U.S. PATENT DOCUMENTS

| 6,617,929 | B2 | 9/2003 | Kim et al. |
| 6,853,245 | B2 | 2/2005 | Kim et al. |
| 7,301,395 | B2 * | 11/2007 | Mobbs .................. 330/124 R |

(Continued)

FOREIGN PATENT DOCUMENTS

| CN | 1479552 A1 | 3/2004 |
| CN | 1781244 A1 | 5/2006 |

(Continued)

OTHER PUBLICATIONS

International Search Report and Written Opinion dated Sep. 27, 2012 for International Application No. PCT/CN2011/002109, International Filing Date: Dec. 15, 2011 consisting of 7-pages.

(Continued)

*Primary Examiner* — Hieu Nguyen
(74) *Attorney, Agent, or Firm* — Christopher & Weisberg, P.A.

(57) ABSTRACT

A multi-way Doherty power amplifier, DPA, is disclosed, comprising a first path comprising a carrier amplifier or at least one carrier amplifier segment partitioned from the carrier amplifier; a second to N-th paths each comprising at least one carrier amplifier segment and/or at least one peaking amplifier segment partitioned from a peaking amplifier; and a power splitter for splitting an input power signal to each of the at least one carrier amplifier segment and/or at least one peaking amplifier segment in a same path, wherein N is an integer not less than 2; a signal preparation unit configured for generating separately input power signal for the first path and each of the second path to N-th paths; and an impedance inverting network configured for combining output signal power from each path. The performance of each amplifier cell can be maximized independently without any compromises made for each other.

26 Claims, 13 Drawing Sheets

(51) Int. Cl.
  *H03F 1/56* (2006.01)
  *H03F 3/60* (2006.01)

(56) References Cited

U.S. PATENT DOCUMENTS

| | | |
|---|---|---|
| 7,541,866 B2 | 6/2009 | Bowles et al. |
| 2007/0205827 A1 | 9/2007 | Mobbs |
| 2010/0148862 A1 | 6/2010 | Woo |
| 2010/0315162 A1 | 12/2010 | Gajadharsing et al. |
| 2011/0140775 A1 | 6/2011 | Hong et al. |
| 2011/0175677 A1 | 7/2011 | Jeong et al. |

FOREIGN PATENT DOCUMENTS

| | | |
|---|---|---|
| CN | 1943106 A1 | 4/2007 |
| CN | 101783652 A1 | 7/2010 |
| CN | 101904089 A1 | 12/2010 |
| EP | 1 887 686 A1 | 2/2008 |
| WO | 2008053534 A1 | 5/2008 |
| WO | 2011112129 A1 | 9/2011 |

OTHER PUBLICATIONS

W. H. Doherty, "A New High Efficiency Power Amplifier for Modulated Waves", Proceedings of the Institute of Radio Engineers, vol. 24, No. 9, Sep. 6, 2006, Technical Papers, pp. 1163-1182, consisting of 20-pages.

Junghwan Moon, et al., "Efficiency Enhancement of Doherty Amplifier through Mitigation of the Knee Voltage Effect", IEEE Transactions on Microwave Theory and Techniques, vol. 59, No. 1, Dec. 3, 2010, pp. 143-152, consisting of 10-page.

Ramzi Darraji, et al., "A Dual-Input Digitally Driven Doherty Amplifier Architecture for Performance Enhancement of Doherty Transmitters", IEEE Transactions on Microwave Theory and Techniques, vol. 59, No. 5, May 10, 2001, pp. 1284-1293, consisting of 10-pages.

Youngoo Yang, et al., Technical Feature, "Optimum Design for Linearity and Efficiency of a Microwave Doherty Amplifier Using a New Load Matching Technique", 2001 IEEE International Microwave Symposium, Phoenix, AZ, Jun. 5, 2011 consisting of 9-pages.

Youngoo Yang, et al., "A Fully Matched N-Way Doherty Amplifier With Optimized Linearity", IEEE Transactions on Microwave Theory and Techniques, vol. 51, No. 3, Apr. 2, 2003, pp. 986-993, consisting of 8-pages.

Nuttapong Srirattana, et al., "Analysis and Design of a High-Efficiency Multistage Doherty Power Amplifier for Wireless Communications", IEEE Transactions on Microwave Theory and Techniques, vol. 53, No. 3, Mar. 14, 2005, pp. 852-860, consisting of 9-pages.

Jangheon Kim, et al., "Optimum Operations of Asymmetrical-Cells-Based Linear Doherty Power Amplifiers—Uneven Power Drive and Power Matching", IEEE Transactions on Microwave Theory and Techniques, vol. 53, No. 5, May 9, 2005, pp. 1802-1809, consisting of 8-pages.

Bumman Kim, et al., "The Doherty Power Amplifier", IEEE Microwave Magazine, vol. 59, No. 7, Nov. 20, 2006, pp. 42-50 consisting of 9-pages.

W. C. Edmund Neo, et al., "A Mixed-Signal Approach Towards Linear and Efficient N-Way Doherty Amplifiers", IEEE Transactions on Microwave Theory and Techniques, vol. 55, No. 5, May 7, 2007, pp. 866-879, consisting of 14-pages.

Marco J. Pelk, et al., "A High-Efficiency 100-W GaN Three-Way Doherty Amplifier for Base-Station Applications", IEEE Transactions on Microwave Theory and Techniques, vol. 56, No. 7, May 23, 2008, pp. 1582-1591, consisting of 10-pages.

Sungwook Kwon, et al., "Inverted-Load Network for High-Power Doherty Amplifier", IEEE Microwave Magazine, Jan. 20, 2009, pp. 93-98 consisting of 6-pages.

Bumman Kim, et al., "Advanced Doherty Architecture", IEEE Microwave Magazine, Jul. 8, 2010, pp. 72-86 consisting of 15-pages.

Idu Kim, et al., "Optimized Design of a Highly Efficient Three-Stage Doherty PA Using Gate Adaptation", IEEE Transactions on Microwave Theory and Techniques, vol. 58, No. 10, Oct. 11, 2010, pp. 2562-2574, consisting of 13-pages.

Supplementary European Search Report dated Mar. 18, 2015 for European Application Serial No. 11877401.7-1810, European Regional Stage Entry Date: Dec. 15, 2011 consisting of 10-pages.

Yong-Sub Lee, et al., "A New Wideband Distributed Doherty Amplifier for WCDMA Repeater Applications", IEEE Microwave and Wireless Components Letters, IEEE, vol. 19(10):668-670, XP011347649A, ISSN: 1531-1309, DOI: 10.1109/LMWC.2009.2029755, Oct. 1, 2009 consisting of 3-pages.

Extended European Search Report dated Jun. 30, 2015 for European Application Serial No. 1 187 7401.7-1810, European Regional Stage Entry Date: Dec. 15, 2011 consisting of 10-pages.

1st Chinese Office Action and Search Report dated Mar. 2, 2016 for Chinese Application Serial No. 201180075488.9, Chinese National Stage Entry Date: Mar. 11, 2005 consisting of 14-pages.

* cited by examiner

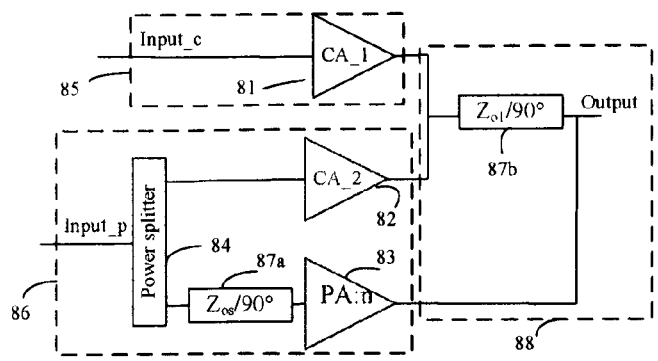
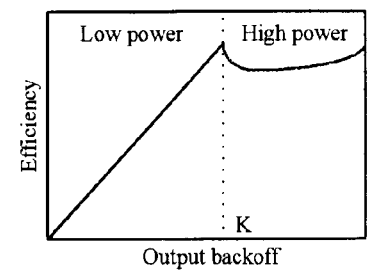
Figure 8 (a)
Figure 8 (b)
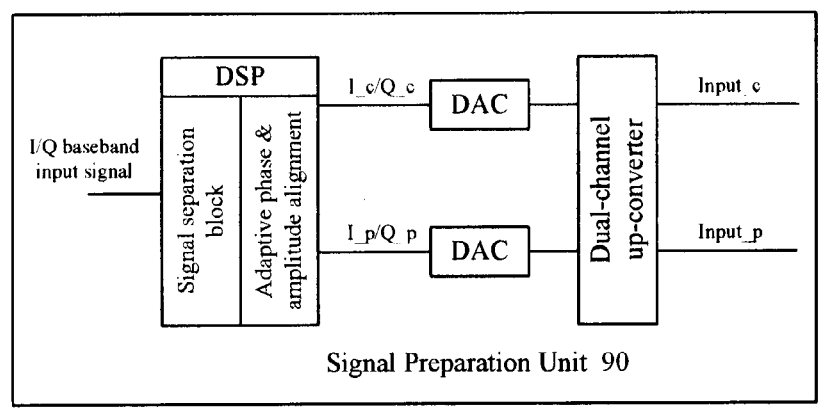
Figure 9

DOHERTY POWER AMPLIFICATION APPARATUS AND METHOD

TECHNICAL FIELD

The invention generally relates to power amplifiers, in particular to a Doherty power amplification apparatus and method.

BACKGROUND

Modern wireless communication networks, such as wideband code division multiple access (WCDMA) and long term evolution (LTE), make use of complex modulation schemes to maximize the data throughput in limited bandwidth. Their resultant communication signals are characterized by a high peak-to-average power ratio (PAPR). This put the emphasis on the importance of improving the average efficiency of RF power amplifiers when driven with high PAPR signals by reducing their power consumption in the back-off region. To obtain the high efficiency at a high back-off power state, numerous efficiency boosting techniques such as EER, ET, LINC, and Doherty have been proposed. Among these, the Doherty power amplifier (DPA) has experienced widespread acceptance and development in recent years, which has been reported to deliver considerably high efficiency because of its advanced design with a simple structure.

In a classical two-way Doherty amplifier shown in FIG. 1, two amplifiers are included: a carrier amplifier (CA) and a peaking amplifier (PA), and their power capability (ratio) is: CA:PA=1:n. The back-off point is at $K=1/(1+n)$, in dB=10 log(k)$^2$. The output powers of two amplifiers operating at a proper phase alignment and bias level are combined in parallel using a quarter-wave transmission line)($Z_{o1}$/90° without the use of any additional components. This "self-managing" characteristic of the Doherty amplifier has made its implementation attractive for various applications. The simplest Doherty amplifier operation can be achieved using two cells with a class-AB biased carrier amplifier cell and a class-C biased peaking amplifier cell, so that they operate at a different power region of an input signal. The carrier amplifier is operational at a low power region and the peaking amplifier is turned on at a high power region.

In the symmetrical two-way Doherty amplifier configuration with same power device for the carrier and peaking amplifier (n=1 in FIG. 1), the saturation power of the carrier amplifier is one-fourth of the maximum system output power. This results in an efficiency peak at 6-dB output power back-off from the normal peak efficiency power level. In the past few years, researchers have focused on the design of asymmetrical Doherty amplifiers (n>1) with uneven power splitter, where the saturation of the carrier amplifier is at a lower level compared to the classical design. Theoretically, asymmetrical Doherty amplifier designs exhibit a significant drop in efficiency in the region between the efficiency peaking points, with the extent of efficiency reduction being proportional to the back-off level, as shown in FIG. 2 illustrating theoretical efficiency characteristics of various DPAs.

Nevertheless, it is possible to use more than two amplifiers to maintain the efficiency without significant dropping throughout the back-off region and extend the back-off level far beyond the classical design. This is the so-called multi-stage or multi-way or N-way (N>2 is a natural number) Doherty amplifier. For instance, the existing two types of 3-way DPAs shown in FIG. 3(a) and FIG. 3(b) have a superior efficiency characteristic because they have three maximum efficiency points along the output power level with the power capability of CA:PA1:PA2=1:n:m. In FIG. 3(a), the first back-off point is at $K1=(1+n)/(1+n+m)$; and the second back-off point is at $K2=1/(1+n)$. In FIG. 3(b), the first back-off point is at $K1=n/(n+m)$; and the second back-off point is at $K2=1/(1+n+m)$.

FIG. 3(a) is a widely known structure as described in Srirattana et al. "*Analysis and design of a high-efficiency multistage Doherty power amplifier for wireless communications*", IEEE Transactions on MTT, March 2005. The topology is a parallel combination of one DPA used as a carrier amplifier with an additional peaking amplifier. The first peaking amplifier (PA1) modulates the load of the carrier amplifier initially and the second peaking amplifier (PA2) modulates the load of the previous Doherty stage at a higher power. The topology in FIG. 3(b) has recently been reported by Gajadharsing et al., "3-*way Doherty amplifier with minimum output network*", U.S. Pat. No. 8,022,760 B2, September 2011. This topology is a parallel combination of one carrier amplifier and one DPA used as a peaking amplifier. Both of the 3-way DPA architectures in FIGS. 3(a) and 3(b) use three power amplifier units, and the two peaking amplifiers are turned on sequentially. Thus, three peak efficiency points are formed respectively at the two turn-on points and at the peak power.

However, due to the lower bias point of the peaking amplifier, its current level is always lower than that of the carrier amplifier. The load impedances of both cells cannot be fully modulated to the value of the optimum impedance for a high power match. Thus, neither cell can generate its respective full power. This limited load modulation will influence the carrier and peaking amplifier working conditions with each other and is often reported as the main source of not only causing a decrease of the maximum output, but a deterioration of a high efficiency operation region. To solve this problem, a more advanced architecture for maximizing performance of a DPA is to utilize the mixed-signal techniques to establish baseband/digital input control of the individual amplifier cells. This approach facilitates the uncompromised control and independent optimization of each amplifier's input drive conditions for maximum efficiency. FIG. 4 shows an existing dual-input digitally driven two-way DPA configuration with adaptive amplitude and phase alignment.

Further, for the output modulation characteristics of a DPA, the full loading matching circuits of the carrier and peaking amplifiers at both low and high power levels should be always required to satisfy the optimum Doherty operation. FIG. 5 illustrates the equivalent-load networks for the 2-way DPA including a simplified equivalent circuit of the active devices. As shown, the output equivalent circuit of the active device can be represented as an ideal current source whose shunt termination has a complex impedance of R+jX. As well known, a microwave Doherty amplifier with a quarter wave transformer can only perform a genuine resistive output matching process. To achieve this, sections of transmission lines which are well-known as offset lines should be inserted in the load matching network, so as to obtain a full output matching for both real and imaginary parts while preserving a highly improved efficiency.

However, these existing solutions set forth above still have some problems.

In practice, it is difficult to obtain the maximum efficiencies of the ideal Doherty at the peak and back-off power levels simultaneously due to the non-ideality of the active devices. FIG. 6 illustrates the typical degraded efficiency performance of a 2-way DPA. Despite the existing technologies to optimize the DPA performance, the active load modulation principle accomplished by the self-managing carrier and peaking amplifiers should be always satisfied. In essence, this load modulation characteristic of DPA also limits its own performance. To achieve the optimized performance, the design considerations on the carrier and peaking amplifiers are different. As to the carrier amplifier, it should be optimized for the overall power range with proper impedance transformation and the cooperation with peaking amplifier. On the other hand, as to the peaking amplifier, its turn-on point and the performance at peak power region should be also carefully optimized simultaneously in accordance with the carrier amplifier working operation. This is to say, the design of carrier and peaking amplifiers should be optimized not only individually, but also as a whole. As a consequence, more often than not, compromises have to be made for the overall performance, as depicted in FIG. 6.

Moreover, when the 2-way DPA is extended to the multi-way realizations which have been proposed recently for advanced communication system with higher PAPR, it will be yet more difficult to optimize the multiple peak efficiency points at back-off power simultaneously. Besides, the Doherty output matching method with offset lines will be less effective in the existing multi-way DPA structures. Since in the existing multi-way DPA realizations, the carrier and/or the peaking amplifiers experience more than two steady impedance states (low- and high-impedance state) with complicated impedance inverting networks. Taken the two types of the 3-way DPAs for example as shown in FIGS. 3(a) and 3(b), respectively, as to the first peaking amplifier (PA1) in the first 3-way DPA, it will endure three steady impedance states for three peaking efficiency points from open circuit state to medium impedance state, and then to low impedance state for high power matching as the input power increases. However, the insertion of offset lines after the output matching networks of the carrier/peaking amplifiers is not sufficient to optimize its efficiency performance. This is because the lengths of offset lines can only be tuned for optimizing one of the impedance states by maintaining another matching state without being changed. Similarly, the CA and PA1 of the second 3-way DPA with three impedance states in FIG. 3 (b) meet similar contradiction. If the power-dependent nonlinearities of the active devices are taken into consideration, it will be even more difficult to optimize the 3-way DPA's performance.

Hence, an improved architecture of Doherty amplifiers with improved performance would be advantageous and desired.

SUMMARY

Accordingly, the invention seeks to preferably mitigate, alleviate or eliminate one or more of the above mentioned disadvantages singly or in any combination.

To solve one or more of the above problems, this disclosure provides a new Doherty amplifier architecture with enhanced efficiency and power performance dedicated to specific power regions, respectively. This has been done by partitioning at least one of the carrier amplifier and/or at least one of the peaking amplifier(s) to different segments according to the required back-off power and peak efficiency points and implementing the dual-/multi-input digitally driven DPA configuration with independent drive-signal control of the individual amplifier at input.

According to a first aspect of the invention, there is provided a multi-way Doherty power amplifier, DPA, comprising: a first path comprising a carrier amplifier or at least one carrier amplifier segment partitioned from the carrier amplifier; a second to N-th paths each comprising at least one carrier amplifier segment and/or at least one peaking amplifier segment partitioned from a peaking amplifier; and a power splitter for splitting an input power signal to each of the at least one carrier amplifier segment and/or at least one peaking amplifier segment in a same path, wherein N is an integer not less than 2; a signal preparation unit configured for generating separately input power signal for the first path and each of the second path to N-th paths; and an impedance inverting network configured for combining output signal power from each path.

In accordance with an optional feature of the invention, the impedance inverting network is further configured for combining output signal power from each carrier amplifier segment and the carrier amplifier; and combining output signal power from each peaking amplifier segment and the peaking amplifier.

In one embodiment, the multi-way DPA is a N-way DPA, N>3, wherein the first path is a first carrier amplifier segment CA_1 partitioned from the carrier amplifier, configured for performance optimization at a low power region and a first peak efficiency point; the second path comprises a second carrier amplifier segment CA_2 partitioned from the carrier amplifier and a first peaking amplifier segment PA1_1 partitioned from a first peaking amplifier PA1, and is configured for performance optimization at a first medium power region and a second peak efficiency point; a third path comprises at least a second peaking amplifier segment PA1_2 partitioned from the first peaking amplifier PA1 and a first peaking amplifier segment PA2_1 partitioned from a second peaking amplifier PA2, and is configured for performance optimization at a second medium power region and a third peak efficiency point; a x-th path comprises at least a second peaking amplifier segment PA(x−2)_2 partitioned from the (x−2)-th peaking amplifier, and a first peaking amplifier segment PA(x−1)_1 partitioned from a (x−1)-th peaking amplifier PA(x−1), (3<x<N); and is configured for performance optimization at a (x−1)-th medium power region and a x-th peak efficiency point; and a N-th path comprises at least a second peaking amplifier segment PA(N−2)_2 partitioned from the (N−2)-th peaking amplifier, and a (N−1)-th peaking amplifier PA(N−1); and the N-th path is configured for performance optimization at a high power region and a N-th peak efficiency point.

In accordance with an optional feature of the invention, the partition is based on a ratio of maximum power ratings among the carrier amplifier and each peaking amplifier.

In accordance with an optional feature of the invention, each carrier amplifier segment and each peaking amplifier segment has no more than two steady impedance states.

In accordance with an optional feature of the invention, there is no output impedance transformation for the first carrier amplifier segment biased at Class-AB or Class-B point in the first path which only has one steady impedance state; and the N paths with different input power signals are turned on sequentially according to input power levels.

In accordance with an optional feature of the invention, each segment and/or the peaking amplifier contained in a same path from the second path to the N-th path are biased at the same Class-C or Class-B point under pinch-off, and are turned on and saturated simultaneously.

In the embodiment, the signal preparation unit is further configured to clip a first peak level signal of the input power signal to generate a first input power signal for the first path; clip a second peak level signal of the input power signal and remove a signal less than a first peak level to generate a second input power signal for the second path; clip a x-th peak level signal of the input power signal and remove a signal less than a (x−1)-th peak level to generate a x-th input power signal for the x-th path; and remove a signal less than a N-th peak level from the input power signal to generate a N-th input power signal for the N-th path.

In accordance with an optional feature of the invention, a peak level is set as a power level at which the carrier amplifier segment and the peaking amplifier segment in one path saturate simultaneously.

In one embodiment, the multi-way DPA is a two-way DPA comprising the first path and the second path, wherein the first path comprises a first carrier amplifier segment CA_1 partitioned from the carrier amplifier, and is configured for performance optimization at a low power region and a first peak efficiency point; and the second path comprises a second carrier amplifier segment CA_2 partitioned from the carrier amplifier and a peaking amplifier PA, and the power splitter for splitting the input power signal to the second carrier amplifier segment CA_2 and the peaking amplifier PA separately; and the second path is configured for performance optimization at a high power region and a second peak efficiency point.

In the embodiment, the partition of the carrier amplifier is based on division equations: CA:PA=1:n; CA_1=1/(1+n)=K; and CA 2=n/(1+n)=1-K; where n is a ratio of maximum power ratings between the carrier amplifier CA and the peaking amplifier PA, K is a back-off design parameter.

In accordance with an optional feature of the invention, the CA_1 is biased at Class-B or Class-AB point, whereas the CA_2 and the PA are biased at the same Class-C or Class-B point.

In accordance with an optional feature of the invention, at a low power region, only the CA_1 is working; the CA_2 and the PA are turned on simultaneously at a high power region whereas the CA_1 is saturated.

In a further embodiment, the multi-way DPA is a three-way DPA comprising the first path, the second path and a third path, wherein the first path comprises a first carrier amplifier segment CA_1 partitioned from the carrier amplifier, and is configured for performance optimization at a low power region and a first peak efficiency point; the second path comprises a second carrier amplifier segment CA_2 partitioned from the carrier amplifier and a first peaking amplifier segment PA1_1 partitioned from a first peaking amplifier PA1, and the power splitter for splitting the input power signal to the second carrier amplifier segment CA_2 and the first peaking amplifier segment PA1_1 separately; and the second path is configured for performance optimization at a medium power region and a second peak efficiency point; and the third path comprises a second peaking amplifier segment PA1_2 partitioned from the first peaking amplifier PA1 and a second peaking amplifier PA2, and the power splitter for splitting the input power signal to the second peaking amplifier segment PA1_2 and the second peaking amplifier PA2 separately; and the third path is configured for performance optimization at a high power region and a third peak efficiency point.

In the embodiment, the partition of the carrier amplifier is based on following division equations: CA:PA1:PA2=1:n:m, K1=(1+n)/(1+n+m), K2=1/(1+n), CA_=K2/K1, CA_2=1−K2/K1, and the partition of the first peaking amplifier PA1 is based on following division equations: PA1_1=K1/K2−1 and PA1_2=n+1-K1/K2; wherein n is a ratio between maximum power ratings of the carrier amplifier CA and the first peaking amplifier PA1; m is a ratio between maximum power ratings of the carrier amplifier CA and the second peaking amplifier PA2; K1 and K2 are back-off design parameters.

In a further embodiment, the multi-way DPA is a three-way DPA comprising the first path, the second path and a third path, wherein the first path comprises a first carrier amplifier segment CA_1 partitioned from the carrier amplifier CA, and is configured for performance optimization at a low power region and a first peak efficiency point; the second path comprises a second carrier amplifier segment CA_2 partitioned from the carrier amplifier CA and a first peaking amplifier segment PA1_1 partitioned from a first peaking amplifier PA1, and the power splitter for splitting the input power signal to the second carrier amplifier segment CA_2 and the first peaking amplifier segment PA1_1 separately; and the second path is configured for performance optimization at a medium power region and a second peak efficiency point; and the third path comprises a third carrier amplifier segment CA_3 partitioned from the carrier amplifier, a second peaking amplifier segment PA1_2 partitioned from the first peaking amplifier PA1 and a second peaking amplifier PA2, and the power splitter for splitting the input power signal to the third carrier amplifier segment CA_3, the second peaking amplifier segment PA1_2 and the second peaking amplifier PA2 separately; and the third path is configured for performance optimization at a high power region and a third peak efficiency point.

In the embodiment, the partition of the carrier amplifier is based on following division equations: CA:PA1:PA2=1:n:m; K1=n/(n+m); K2=1/(1+n+m); CA_1=K2; CA_2=K1−K2; CA 3=1−K1; and the partition of the first peaking amplifier PA1 is based on following division equations: PA1_1=K1 (K1/K2−1) and PA1_2=n−K1/(K1/K2−1); wherein n is a ratio between maximum power ratings of the carrier amplifier CA and the first peaking amplifier PA1; m is a ratio between maximum power ratings of the carrier amplifier CA and the second peaking amplifier PA2; K1 and K2 are back-off design parameters.

In accordance with an optional feature of the invention, the first carrier amplifier segment CA_1 in the first path is biased at Class-B or Class-AB point; each segment and/or the second peaking amplifier PA2 in the same other path are biased at the same Class-C or Class-B point.

In accordance with an optional feature of the invention, at a low power region, only the first carrier amplifier segment CA_1 is working; the segments in the second path are turned on simultaneously at a first medium power region whereas the CA_1 is saturated; the segments and PA2 in the third path are turned on simultaneously at a high power region whereas the segments in the second path are saturated simultaneously.

In a further embodiment, the multi-way DPA is a three-way DPA comprising the first path and the second path, wherein the first path comprises the carrier amplifier CA and a first peaking amplifier segment PA1_1 partitioned from a first peaking amplifier PA1, and the power splitter for splitting the input power signal to the carrier amplifier CA and the first peaking amplifier segment PA1_1 separately; and the first path is configured for performance optimization at first two power regions and first two peak efficiency points; and the second path comprises a second peaking amplifier segment PA1_2 partitioned from the first peaking amplifier PA1 and a second peaking amplifier PA2, and the power splitter for splitting the input power signal to the second peaking amplifier segment PA1_2 and the second peaking amplifier PA2 separately; and the second path is configured for performance optimization at a high power region and a third peak efficiency point.

In the embodiment, the partition of the first peaking amplifier PA1 is based on following division equations: CA:PA1:PA2=1:n:m, K1=(1+n)/(1+n+m), K2=1/(1+n), and PA1_1=K1/K2−1 and PA1_2=n+1−K1/K2; wherein n is a ratio between maximum power ratings of the carrier amplifier CA and the first peaking amplifier PA1; m is a ratio between maximum power ratings of the carrier amplifier CA and the second peaking amplifier PA2; K1 and K2 are back-off design parameters.

In a further embodiment, the multi-way DPA is a three-way DPA comprising the first path and the second path, wherein the first path comprises a first carrier amplifier segment CA_1 partitioned from the carrier amplifier CA and a first peaking amplifier segment PA1_1 partitioned from a first peaking amplifier PA1, and the power splitter for splitting the input power signal to the first carrier amplifier segment CA_1 and the first peaking amplifier segment PA1_1 separately; and the first path is configured for performance optimization at first two power regions and first two peak efficiency points; and the second path comprises a second carrier amplifier segment CA_2 partitioned from the carrier amplifier CA, a second peaking amplifier segment PA1_2 partitioned from the first peaking amplifier PA1, and a second peaking amplifier PA2, and the power splitter for splitting the input power signal to the second carrier amplifier segment CA_2, the second peaking amplifier segment PA1_2 and the second peaking amplifier PA2 separately; and the second path is configured for performance optimization at a high power region and a third peak efficiency point.

In the embodiment, the partition of the carrier amplifier is based on following division equations: CA:PA1:PA2=1:n:m; K1=n/(n+m); K2=1/(1+n+m); CA_1=K1; CA_2=1−K1; and the partition of the first peaking amplifier PA1 is based on following division equations: PA1_1=K1 (K1/K2−1); PA1_2=n−K1/(K1/K2−1); wherein n is a ratio between maximum power ratings of the carrier amplifier CA and the first peaking amplifier PA1; m is a ratio between maximum power ratings of the carrier amplifier CA and the second peaking amplifier PA2; K1 and K2 are back-off design parameters.

In accordance with an optional feature of the invention, the carrier amplifier CA or the first carrier amplifier segment CA_1 in the first path is biased at Class-AB or Class-B point and the first peaking amplifier segment PA1_1 of the first peaking amplifier is biased at Class-C point; and each segment and the second peaking amplifier PA2 in the second path is biased at the same Class-C or Class-B point.

In accordance with an optional feature of the invention, at a low power region, only the carrier amplifier CA or the first carrier amplifier segment CA_1 in the first path is working; the first peaking amplifier segment PA1_1 of the first peaking amplifier in the first path is turned on at a first medium power region whereas the CA or CA_1 is saturated, but with impedance transform in-between two steady impedance states and works together with the PA1_1 at the first medium power region; the segments and PA2 in the second path are turned on simultaneously at a high power region whereas the CA or CA_1 and PA1_1 both come to saturation and maximum output power simultaneously.

According to a second aspect of the invention, there is provided a method for power amplifying by Doherty Power Amplifier, DPA, according to the invention, comprising: generating separately an input power signal for each path from the signal preparation unit; amplifying the input power signal with at least a carrier amplifier segment and/or at least a peaking amplifier segment in each path; and combining output signal power from each path via an impedance inverting network.

According to these aspects of the invention, the performance of each amplifier cell may be maximized independently without any compromises made for each other, which in turn also facilitates the implementation of the Doherty amplifier. In addition, the segmented carrier and peaking cells have no more than two impedance states. Consequently, the optimized offset lines may be added and tuned at the output network of each amplifier cell without any degradation of the overall performance. The proposed architectures and method may be implemented in different 2-way as well as N-way Doherty amplifiers with various output impedance transformation networks.

BRIEF DESCRIPTION OF THE DRAWINGS

The features and advantages of the invention will be more apparent from the following exemplary embodiments of the invention with reference to the accompanied drawings, in which

FIGS. 8($a$) and 8($b$) illustrate schematic diagrams of a dual-input digital DPA with two carrier amplifier segments and its efficient plot according to an embodiment of the present invention;

FIG. 9 illustrates a schematic diagram of a signal preparation unit employed in the dual-input digital DPA as shown in FIG. 8($a$);

DETAILED DESCRIPTION

Figure 1:
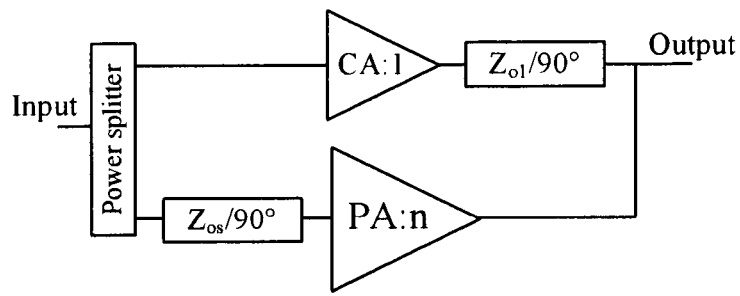
FIG. 1 illustrates a conventional 2-way DPA configuration.
Figure 2:
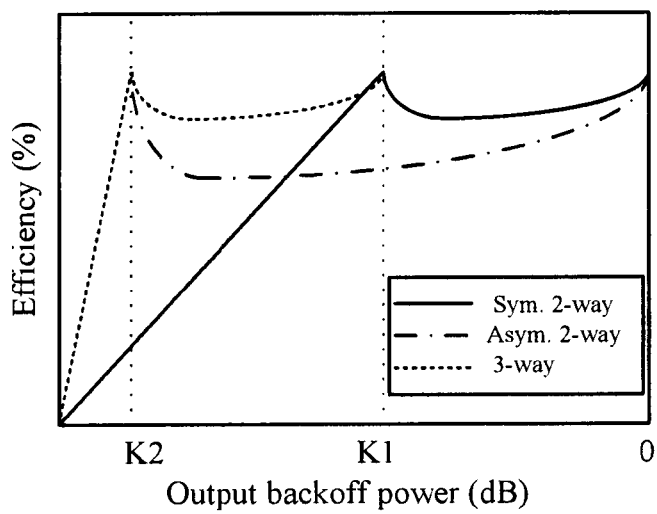
FIG. 2 illustrates a schematic diagram of the theoretical efficiency characteristics of various DPAs.

Embodiments of the invention will be described thoroughly hereinafter with reference to the accompanied drawings. It will be apparent to those skilled in the art that the invention may, however, be embodied in many different forms and should not be construed as limited to the embodiments and specific details set forth herein. Like numbers refer to like elements throughout the description.

Embodiments of the invention may be applied in various wireless networks, such as WCDMA, GSM, 3GPP LTE etc. Given the rapid development in communications, there will of course also be future type wireless communications technologies and systems with which the present invention may be embodied. It should not be seen as limiting the scope of the invention to only the aforementioned system.

Furthermore, it is also to be noted that, in the context of the present invention, the term "segment", "carrier amplifier segment" or "peaking amplifier segment" is used to refer to part of a carrier amplifier or part of peaking amplifier partitioned according to a certain power ratio, which actually may also be implemented as an individual power amplifier with a suitable power parameter. For example, as shown in FIGS. 8(a), 11(a), 12-16 of the embodiments of the invention, the devices identified as CA_1, CA_2, CA_3, CA_N+1, PA 1_1, PA1_2, PA1_N, PA2_1, PA2_N−1 ... may respectively be referred as a segment. The segments may also be implemented as a series of amplifiers with suitable power parameters connected together in various manners.

In the context of the invention, the term "path" is used to define an entity including segment or an undivided carrier amplifier or an undivided peaking amplifier shared a same power splitter as well as an individual input power signal. For example, in a two-way Doherty power amplifier shown as FIG. 8(a) according to an embodiment of the invention, two paths indicated by dotted blocks are included, one is the entity 85 comprising the carrier amplifier segment 81 identified as CA_1 with the input power signal identified as Input_c; another is the entity 86 including the carrier amplifier segment 82 identified as CA_2 and an undivided peaking amplifier 83 identified as PA:n with one power splitter 84 supplied by an individual input power signal identified as Input_p.

Additionally, the term "cell", or "branch" corresponds to part of the path mentioned above which contains one segment or one undivided amplifier supplied by one split power signal from the power splitter. For example, as shown in FIG. 8(a), two paths are included in the two-way DPA of the invention, wherein the first path includes one cell or one branch; the second path includes two cells or two branches. Similarly, the three-way DPA of the invention shown in FIG. 12 includes two paths, wherein the first path includes two cells/branches, and the second path includes three cells/branches.

In order to enhance the DPA's performance for both back-off and high power regions, the invention provides various embodiments with new design methodologies and improved Doherty architectures. However, the active load-pulling design principle at the output load of the Doherty amplifier with impedance inverting networks should be always abided, which requires the carrier and peaking amplifiers co-operate well with each other for different power regions. Besides, the output coupling network of each amplifier should be properly designed to be fully matched for both high impedance and low impedance state. On the other hand, the requirements for the optimum DPA operation often make the carrier and peaking cell design constrained to each other. If one of the amplifiers design is not well behaved, neither cell can generate its respective full power and efficiency. In practice, the non-idealities due to the power transistors, transmission lines, DC biasing points, etc., will make it more difficult to obtain the maximum efficiencies of the ideal Doherty amplifier at the peak and back-off power levels simultaneously. More often than not, compromises have to be made for the overall performance.

One may now resort to add the offset lines at the input and output of the carrier and peaking amplifiers, so as to have a fine tuning of the DPA performance. However, this design method is bandwidth limited and will meet obstacles in multi-way DPA configurations with multiple peak efficiency points for efficiency enhancement. Because the additional offset lines can only be tuned such that a matching state can be maintained without being changed for one power level but can be adjusted at the other power level. However, in the multi-way Doherty architectures, more than two power levels with corresponding impedance states for carrier amplifier as well as peaking amplifiers should be fulfilled.

Figure 7:
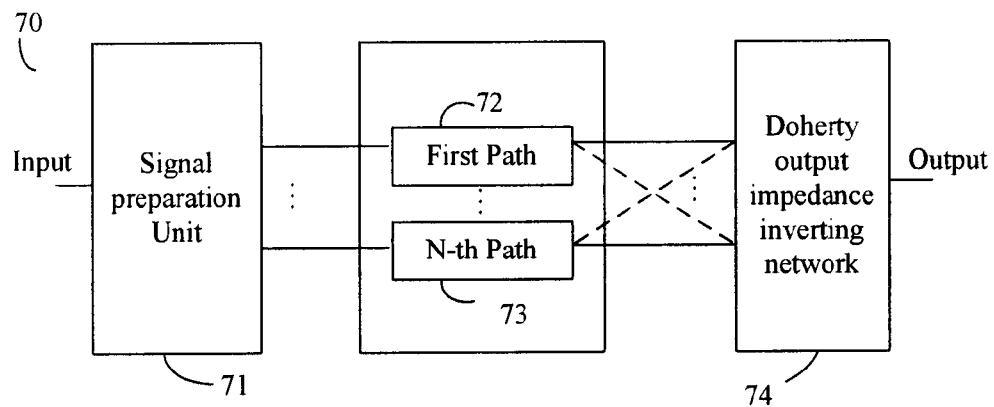
FIG. 7 illustrates a structural schematic diagram of a general multi-way DPA according to an embodiment of the present invention.

At this point, embodiments of the invention provide improved Doherty architectures so as to adapt to the optimum Doherty operation. According to the embodiments of the invention, the improved Doherty power amplifier architecture 70 as shown in FIG. 7 in general includes N-th paths 72, 73, a signal preparation unit 71 and an impedance inverting network 74. The first path 72 includes a carrier amplifier or at least one carrier amplifier segment partitioned from the carrier amplifier; the second to N-th paths 72, 73 each include at least one carrier amplifier segment and/or at least one peaking amplifier segment partitioned from a peaking amplifier; and a power splitter for splitting an input power signal to each of the at least one carrier amplifier segment and/or at least one peaking amplifier segment in a same path, wherein N is an integer not less than 2; the signal preparation unit 71 is configured for generating separately input power signal for the first path and each of the second path to N-th paths; and an impedance inverting network 74 is configured for combining output signal power from each path.

In one embodiment, referring to FIG. 8(a), there is provided an improved architecture of dual-input digitally driven two-way Doherty amplifier.

The architecture of dual-input digitally driven two-way Doherty amplifier shown in FIG. 8(a) includes three components: two paths 85, 86 for amplifying input power signals from a signal preparation unit 90 as shown in FIG. 9; the signal preparation unit 90 for generating separately input power signals supplied to individual paths 85, 86; and an impedance inverting network 88 for combining output signal power of the paths 85, 86. The first path 85 comprises a first carrier amplifier segment 81 CA_1 partitioned from a carrier amplifier and the second path 86 comprises a second carrier amplifier segment 82 CA_2 partitioned from the carrier amplifier and a peaking amplifier 83 PA, and a power splitter 84 for splitting the input power signal to the second carrier amplifier segment 82 CA_2 and the peaking amplifier 83 PA separately. At the input of the PA 83 branch of the second path 86, a quarter-wave line 87 is included for compensating the phase shift brought by the Doherty impedance inverter 87*b* at the output of the CA_1 and CA_2 branches.

At the output, the impedance inverting network 88 firstly combines the output signal power of the carrier amplifier segments 81 CA_1 and 82 CA_2 at the input of the Doherty impedance inverter 87*b*, which is a quarter-wave line in this embodiment. And this combined output signal power is then combined with the output signal power of PA at the output of the Doherty impedance inverter 87*b*.

In the embodiment of the invention, the first path 85 is configured for performance optimization at a low power region and a first peak efficiency point; and the second path 86 is configured for performance optimization at a high power region and a second peak efficiency point.

In this embodiment, the carrier amplifier CA as shown in the classical structure as shown in FIG. 1 is now divided into two smaller amplifiers (CA_1 and CA_2). The power division may be based on the following division equations: CA:PA=1:n; CA_1=1/(1+n)=K; and CA_2=n/(1+n)=1−K, where n is a ratio of maximum power ratings between the carrier amplifier CA and the peaking amplifier PA, K is a back-off design parameter.

In the embodiment, the CA_1 81 is still biased in Class-B or deep Class-AB condition, while CA_2 82 is biased at the same Class-C or Class-B point as in the peaking amplifier (PA) 83. As a consequence, the partitioned CA_1 81 and CA_2 82 will turn on in sequence, and the proposed Doherty architecture can be also known as the "Sequential DPA". CA_1 81 is now in single-ended power amplification with no modulation from the low-power region to the high-power region, and CA_1 81 comes to saturation and maximum output power at first peak efficiency point while CA_2 82 and PA 83 are turned on simultaneously. The performance of CA_1 81 can be maximized for low power region without compromise being made for the overall power range and the cooperation with peaking amplifier. Moreover, CA_1 81 can be designed to be wideband and high-efficiency as in Class-AB or switching-mode amplifier design. The amplitude of the input power signal Input_c can be controlled using the known digital Doherty method so as not to overdrive CA_1 81. With offset line optimization for CA_2 82 and PA 83 shown in FIG. 9 to make their impedances high enough at back-off, the DPA performance in low power region is then determined on CA_1 81 independently. Besides, high enough impedance is not a concrete value for power matching, so relatively wideband operation may also be realized as to CA_2 82 and PA 83 for high power matching. In this digital Doherty configuration, no input power signal is needed to "Input_p" path (the second path 86) in low power level. This further facilitates the design and control of the DPA according to the embodiment of the invention.

According to the improved dual-input digitally driven DPA in the embodiment, the performance shown in FIG. 8(b) may be enhanced compared to prior arts. Because in this new DPA architecture, the efficiency for different power states may be optimized independently with the corresponding amplifier path, whereas in the prior configuration shown as FIG. 1, the carrier and peaking amplifier design often influences with each other, resulting in performance degradation.

It is also well known that the efficiency at the back-off region of the Doherty amplifier is more important than the efficiency at the peak power region for amplification of the modulated signal with high PAPR. At the low power state, only CA_1 81 is working, and the DPA's performance may be optimized by designing the input and output matching networks of CA_1 81 for maximum efficiency and output power. Since CA_1 81 has reduced parasitic elements and smaller output shunt capacitance compared to CA with larger device in the prior configuration as in FIG. 1, higher efficiency, better linearity, and wider Visual Bandwidth (VBW) may also be expected with the present invention, which are important feature of merits for a Doherty amplifier.

In the embodiment, the signal preparation unit 90 with dual-input may be implemented, for example, as shown in FIG. 9. It is used for the input signal separation, phase compensation, amplitude balance, processing and up-conversion, etc. This facilitates the uncompromised control and independent optimization of each amplifier drive-signal for maximum efficiency. In the dual-input digitally driven Doherty amplifier structure, the input signal of each path is digitally preprocessed and supplied separately to each path of the DPA in order to optimize the overall performance. Digital signal processing is applied to mitigate the performance degradation due to phase impairment in DPA's paths. This is achieved by adaptively aligning the phases of the carrier and peaking paths for all power levels after the peaking amplifier is turned on. Similarly, the amplitude imbalance control can be also incorporated in a dual-input DPA with independent drive-signal shaping, so as to help out the Doherty active load modulation.

At high power region (Doherty power region) as shown in FIG. 8(b), CA_2 82 and PA 83 are responsible for the whole DPA's performance, and they are biased at the same Class-C or Class-B point turned on simultaneously with suitable input power drive, while the CA_1 81 keeps the saturation power unchanged without being heavily overdriven. Such adaptive phase and amplitude alignment is guaranteed by the dual-input digital Doherty structure with signal preprocessing in digital domain. Since CA_2 82 and PA 83 are biased under same conditions, the input power splitter is found to be enough for a fixed ratio of power division. Because CA_2 82 in carrier branch and PA 83 in peaking branch are biased at the same bias point, this new Doherty configuration also provides another benefit to reduce the gain imbalance as well as phase variation between the two branches of DPA, which is an important feature for realizing maximum output and high efficiency in the high-power Doherty region. Moreover, the gain imbalance as well as phase variation difference between the carrier and peak branches may be reduced, and smoother AM-AM and AM-PM curves of the ideal DPA operation may be expected, which in turn facilitate Digital Pre-Distortion (DPD) convergence.

Figure 10:
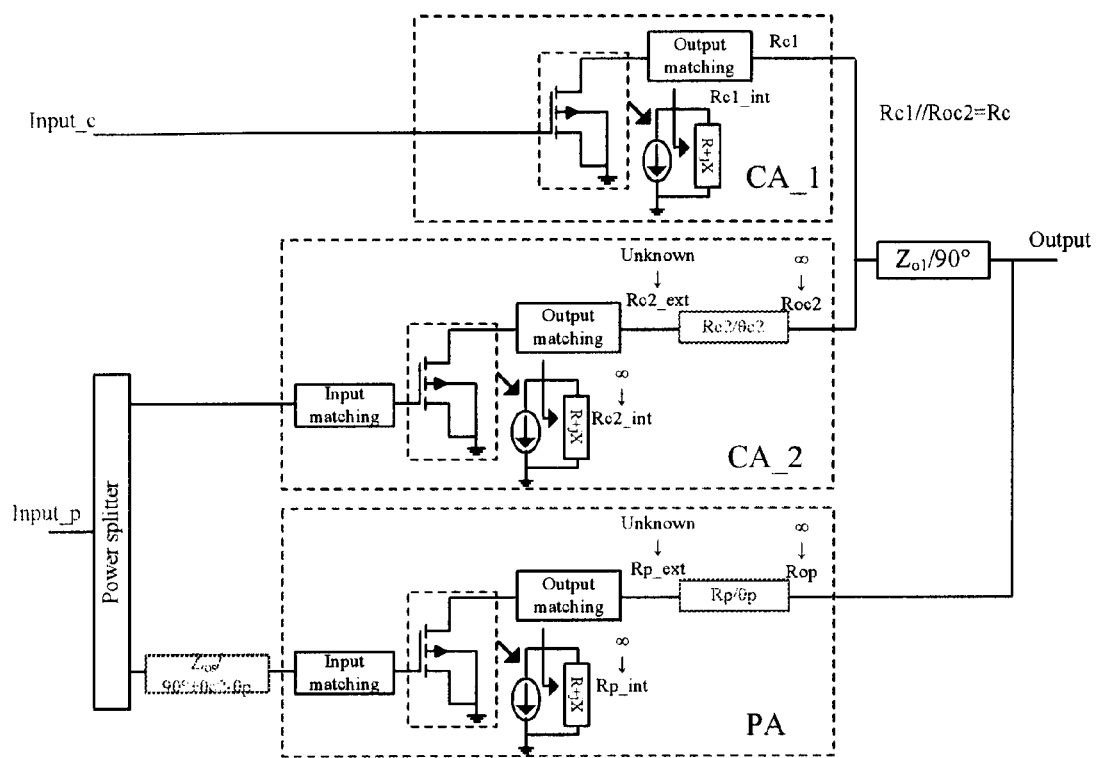
FIG. 10 illustrates a schematic diagram of an output equivalent load network for the 2-way DPA with offset lines according to an embodiment of the present invention.

An exemplary schematic diagram of the impedance inverting network (equivalent load network) for the 2-way DPA with offset lines is shown in FIG. 10 according to the embodiment of the invention. The offset lines are incorporated in the embodiment of the present invention. Since CA_1 81 does not require impedance inverting with only one impedance state, there is no need to add offset lines at the output of CA_1 81. The offset lines may be inserted in CA_2 82 and PA 83 to make their output off-state impedance high enough so as not to load CA_1 82 in the low power region. Thus, the offset lines' lengths may be tuned and determined easily to ensure the DPA's performance. In addition, higher bandwidth and efficiency of the new DPA of the invention may be expected. Because now CA_1 81 does require the inversion from the high impedance to the low impedance, it may be designed to be wideband in general Class-AB amplification or in high-efficiency switching-mode amplification. On the other hand, the CA_2 82 and PA 83 may also be designed to be wideband and high efficiency for high power matching, and their high off-state impedances tuned by the offset lines can be easily achieved in wide bandwidths so as not to load the carrier amplifier in the low power region.

Figure 11:
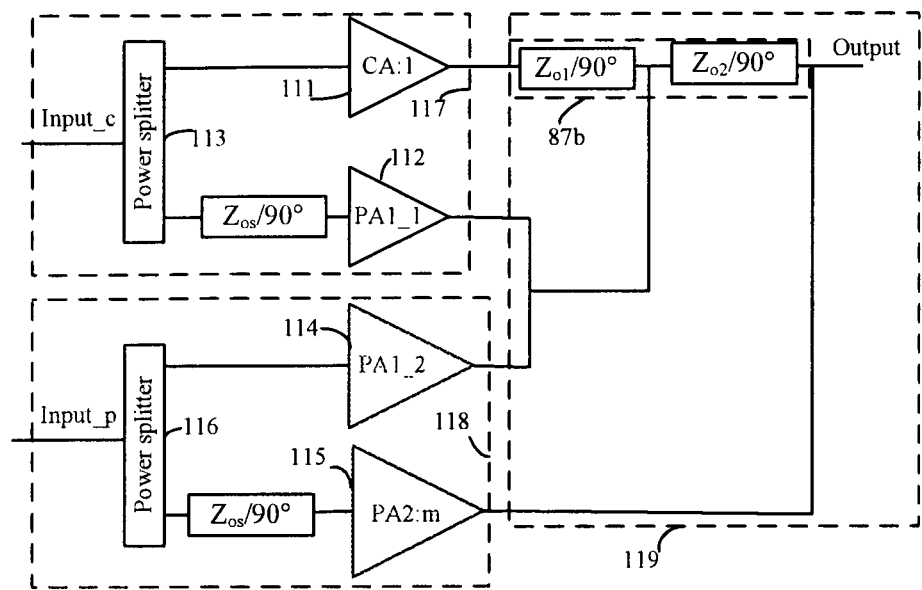
FIGS. 11($a$) and 11($b$) illustrate schematic diagrams of an architecture for a 3-way DPA and its efficient plot according to an embodiment of the present invention.
Figure 11:
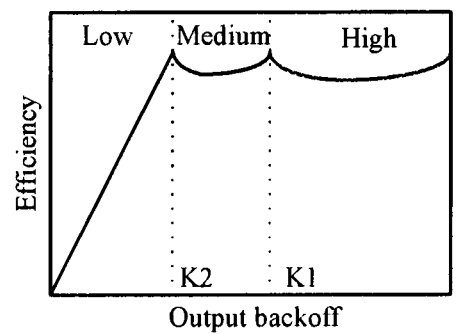
Figure 12:
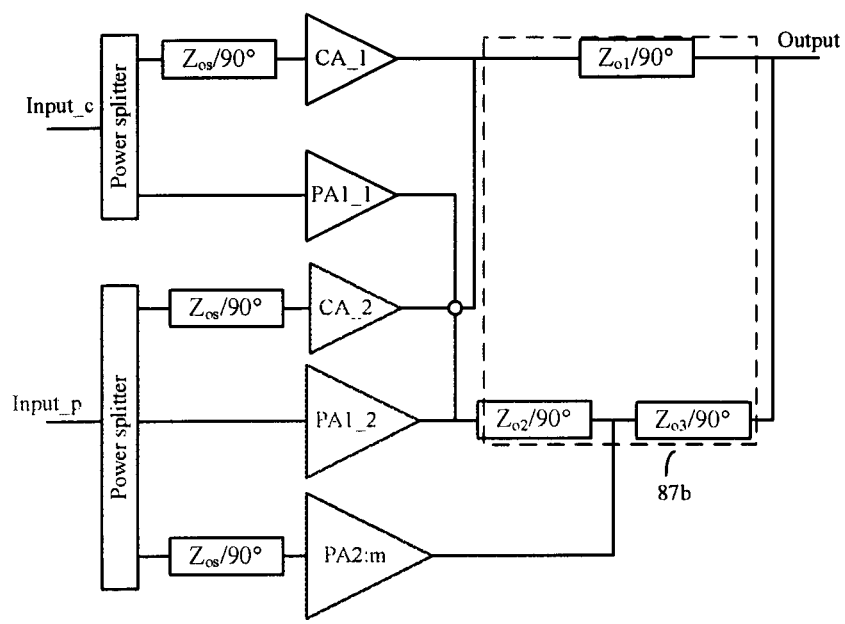
FIG. 12 illustrates a schematic diagram of an architecture for a 3-way DPA according to an embodiment of the present invention.

FIGS. 11(a) and 12 show two types of improved 3-way dual-input Digital DPAs including carrier and peaking amplifier segment(s) partitioned from the prior amplifier cells as shown in FIGS. 3(a) and 3(b), respectively, and the efficiency plots for the three different power regions optimized by respective amplifier segments are also indicated.

FIG. 11(a) shows an improved architecture corresponding to the existing 3-way DPA architectures in FIG. 3(a). In the new 3-way DPA architecture, similarly as in FIG. 8(a), three components are included: two paths 117, 118 for amplifying input power signals from a signal preparation unit; the signal preparation unit for generating separately input power signals supplied to individual paths; and an impedance inverting network 119 for combining output signal power of the paths.

The signal preparation unit outputs two individual power signals to the corresponding two paths, here will not be described in detail again since it is in the same structure as the one for the two-way DPA of the invention shown in FIG. 9.

At the output, the impedance inverting network 119 firstly combines the output signal power of the first peaking amplifier segments 112 PA1_1 and 114 PA1_2 at the input of the Doherty impedance inverter 87b, which is consisted of two series-connected quarter-wave transformation lines in this embodiment. And the combined output signal power of the first peaking amplifier is then combined with the output signal power of the carrier amplifier 111 CA and the second peaking amplifier 115 PA2 at the output of the Doherty impedance inverter 87b.

In the embodiment, the first path 117 comprises an undivided carrier amplifier 111 CA and a first peaking amplifier segment 112 PA1_1 partitioned from a first peaking amplifier PA1, and the power splitter 113 for splitting the input power signal to the carrier amplifier 111 CA and the first peaking amplifier segment 112 PA1_1 separately. The second path 118 comprises a second peaking amplifier segment 114 PA1_2 partitioned from the first peaking amplifier PA1 and a second peaking amplifier 115 PA2, and the power splitter 116 for splitting the input power signal to the second peaking amplifier segment 114 PA1_2 and the second peaking amplifier 115 PA2 separately. The first path 117 is configured for performance optimization at first two power regions and first two peak efficiency points; and the second path 118 is configured for performance optimization at a high power region and a third peak efficiency point.

In the embodiment, the first peaking amplifier PA1 is partitioned based on following division equations: CA:PA1:PA2=1:n: m; K1=(1+n)/(1+n+m); K2=1/(1+n); and PA1_1=K1/K2−1; PA1_2=n+1−K1/K2, where n is a ratio between maximum power ratings of the carrier amplifier CA and the first peaking amplifier PA1; m is a ratio between maximum power ratings of the carrier amplifier CA and the second peaking amplifier PA2; K1 and K2 are back-off design parameters.

Since the 3-way DPA has three peak efficiency points the carrier and/or the peaking amplifiers may have three steady impedance states corresponding to the low power region, medium power region (Doherty power region1), and high power region (Doherty power region2), respectively. The steady impedance state means the output impedance value of each amplifier cell at the power level when the DPA achieves one of its peak efficiency points. Similarly, a power region includes the power levels in-between two efficiency points of the DPA. Thus at each peak efficiency point, each amplifier will have a steady impedance state.

As to the first type of 3-way DPA in FIG. 3(a), the impedance of the first peaking amplifier (PA1) has three steady impedance states with the increase of input power level. At the beginning it should be high enough (open circuit) for low input power, then is transformed to medium impedance from the first to second peak efficiency point, and finally transformed to low impedance until peak power (third efficiency point). As discussed, the addition of offset lines can only be used to optimize the performance of amplifier cells in the DPA with not more that two impedance states, otherwise compromises have to be made for overall performance. In order to overcome this drawback in the conventional 3-way DPA, PA1 has been partitioned to two parts (PA1_1 112 and PA1_2 114) in the new Doherty architectures as shown in FIG. 11(a). As shown with the corresponding efficiency plot in FIG. 11(b), CA 111 biased in Class-AB together with PA1_1 112 biased in Class-C behaves like a classical two-way Child DPA for efficiency enhancement in the low power and medium power region. CA 111 and PA1_1 112 both come to saturation and maximum output power at second peak efficiency point while PA1_2 114 and PA2 115 are turned on simultaneously.

PA1_2 114 together with PA2 115 biased in the same Class-C or Class-B point which are turned on at the second peak efficiency point to maintain high efficiency in the high power Doherty region2. In this way, the PA1_1 112 only has two impedance levels from open-state to power matching state for first two peak efficiency points. Similarly, PA1_2 114 also only has two impedance levels from open-state to power matching state for the third peak efficiency point. Besides, the dual-input digitally driven Doherty structure ensures appropriate input signal's amplitude (for instance, not to overdrive CA 111 and PA1_1 112 in heavy saturation) and phase alignment for each branch so as to constitute the whole 3-way Doherty operation.

In conventional dual-input digital 3-way DPA with PA1 and PA2 sharing the same input signal, PA1 and PA2 are biased in different Class-C biasing points with analog power splitter at input, their respective optimum input amplitude and phase alignment may not be obtained simultaneously. In the new 3-way DPA of the embodiment in the present invention, since PA1_2 114 and PA2 115 are biased at the same Class-C or Class-B point responsible for the Doherty performance in the high-power region, they may have consistent AM-AM and AM-PM behaviors using uniform input signal shaping.

Figure 3:
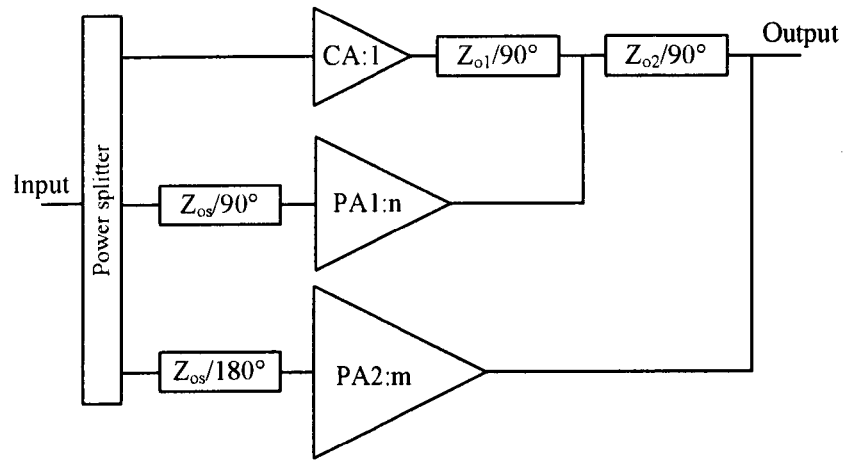
FIGS. 3($a$) and 3($b$) illustrate schematic diagrams of two types of existing 3-way DPA architectures.
Figure 3:
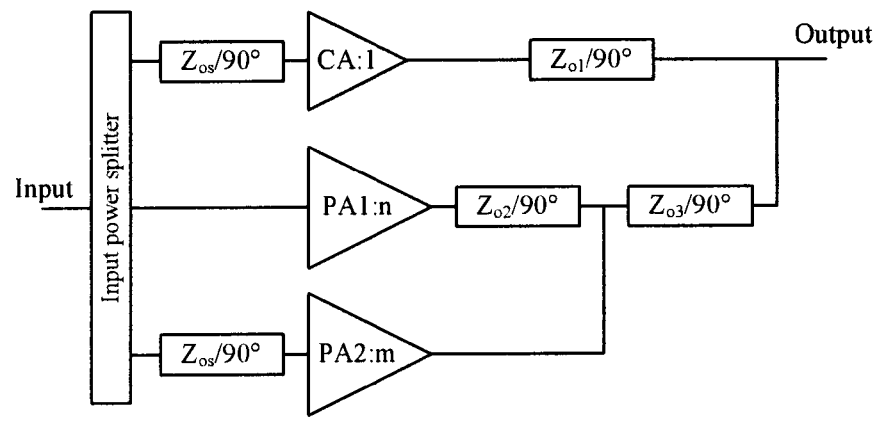
Figure 4:
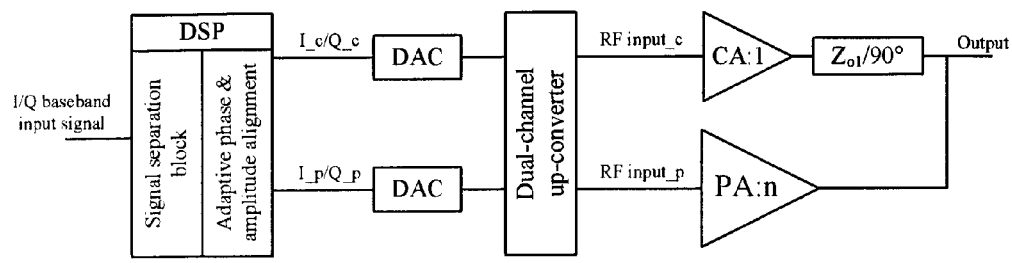
FIG. 4 illustrates a schematic diagram of a dual-input digitally driven 2-way DPA.
Figure 5:
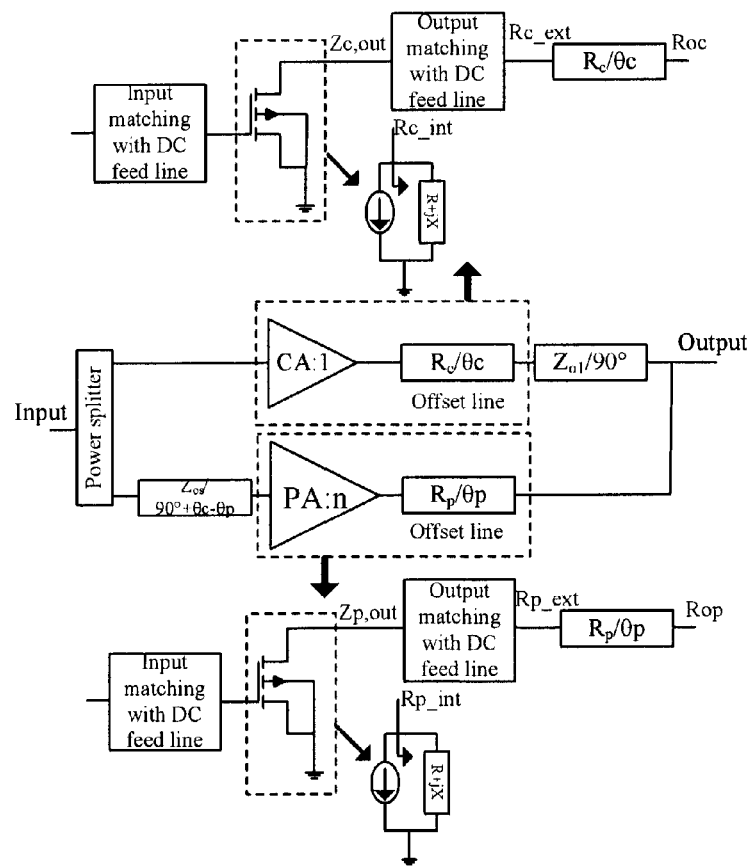
FIG. 5 illustrates a schematic diagram of an output equivalent load network for the 2-way DPA with power matching networks and offset lines.
Figure 6:
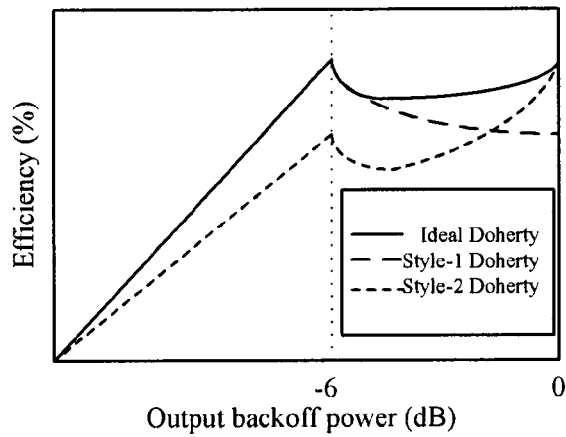
FIG. 6 illustrates a schematic diagram of an ideal and degraded efficiency of the 2-way DPA.

FIG. 12 illustrates another improved architecture of 3-way DPA corresponding to the second type of existing 3-way DPA shown in FIG. 3 (b). Similar partition of PA1 into two segments has been done as shown in FIG. 11(a). In addition, since the carrier amplifier CA in this 3-way Doherty architecture is fully modulated with three steady impedance states over the whole power regions for three peak efficiency points, it is further divided into two parts (CA_1 and CA_2). Then CA_1 biased in Class-AB with only two impedance states like that in the classical two-way Child DPA as shown in FIG. 1 together with PA1_1 biased in Class-C are responsible for the maximum performance of the first two peak efficiency points. And the remaining CA_2, PA1_2 and PA2 amplifier cells biased in the same Class-C or Class-B point are turned on at the same time from open state to power matching state for the high power region as well as the third peak efficiency point.

The signal preparation unit outputs two individual power signals to the corresponding two paths, here will not be described in detail again since it is in the same structure as the one for the two-way DPA of the invention shown in FIG. 9.

At the output, the impedance inverting network firstly combines the output signal power of the carrier amplifier segments CA_1 and CA_2 and the output signal power of the first peaking amplifier segments PA1_1 and PA1_2 at the input of the Doherty impedance inverter 87b, which is consisted of three connected quarter-wave transformation lines in this embodiment. And the combined output signal power of the carrier amplifier and the first peaking amplifier is then combined with the output signal power of the second peaking amplifier 115 PA2 at the output of the Doherty impedance inverter 87b.

In this embodiment, the partition of the carrier amplifier is implemented based on following division equations: CA:PA1:PA2=1:n:m; K1=n/(n+m); K2=1/(1+n+m); CA_1=K1; CA_2=1−K1; and the partition of the first peaking amplifier PA1 is implemented based on following division equations: PA1_1=K1(K1/K2−1) and PA1_2=n−K1/(K1/K2−1); where n is a ratio between maximum power ratings of the carrier amplifier CA and the first peaking amplifier PA1; m is a ratio between maximum power ratings of the carrier amplifier CA and the second peaking amplifier PA2; K1 and K2 are back-off design parameters.

It is to be noted that for concise purpose the similar components or features as the above embodiments will not be described here.

Figure 13A:
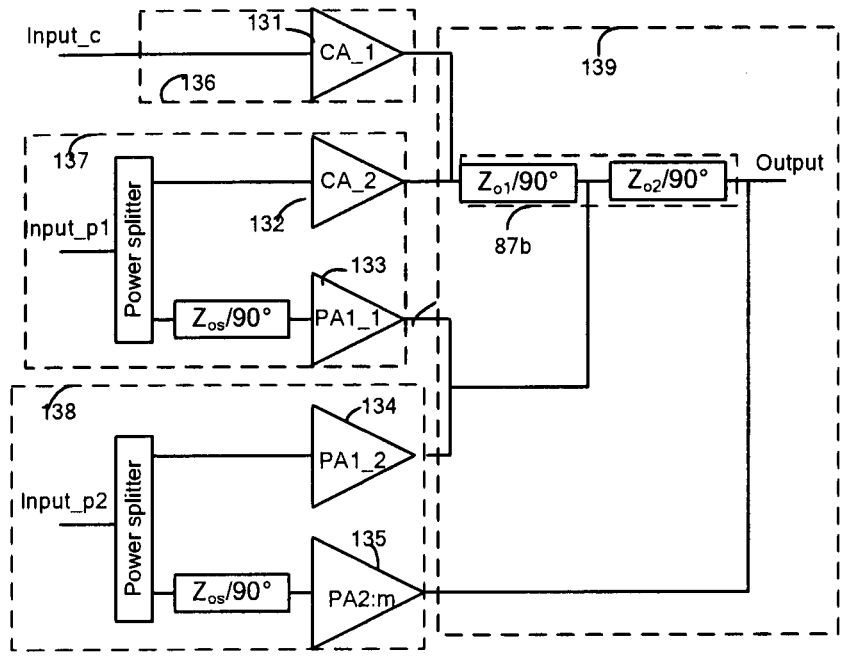
FIGS. 13($a$) and 13($b$) illustrate schematic diagrams of an architecture for a 3-way DPA and its efficient plot according to an embodiment of the present invention.
Figure 14:
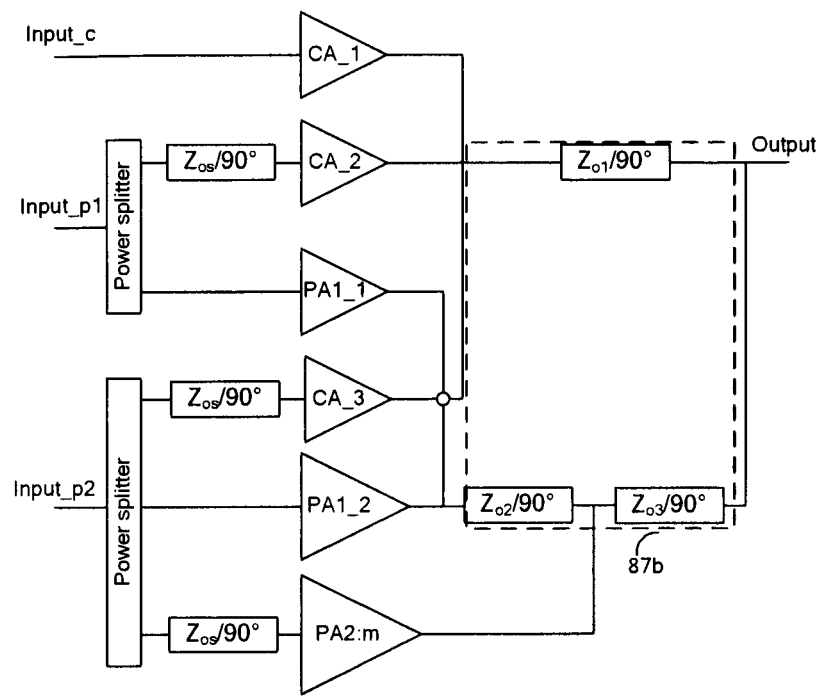
FIG. 14 illustrates a schematic diagram of an architecture for a 3-way DPA according to an embodiment of the present invention.

Further, the carrier amplifier in the Child DPA of the two 3-way DPA architectures in FIGS. 11(a) and 12 may be further partitioned into the architectures as shown in FIGS. 13(a) and 14, so as to optimize the performance of the low power region and Doherty (medium) power region, respectively.

In particular, FIG. 13(a) shows a further partitioned architecture corresponding to FIG. 11(a). In particular, the improved architecture shown in FIG. 13(a) also includes three components: three paths 136, 137, 138 for amplifying input power signals from a signal preparation unit; the signal preparation unit for generating separately input power signals supplied to individual paths; and an impedance inverting network for combining output signal power of the paths.

Here, the signal preparation unit outputs three individual power signals to the corresponding three paths, and will not be described in detail again since it is similar with the one for the two-way DPA of the invention shown in FIG. 9 except three individual power signals rather than two. In particular, the original input power signal is clipped and removed in a power level corresponding to one of the three peak efficiency points so as not to overdrive the amplifier segments in each path.

The first path 136 comprises a first carrier amplifier segment 131 CA_1 partitioned from the carrier amplifier; the second path 137 comprises a second carrier amplifier segment 132 CA_2 partitioned from the carrier amplifier and a first peaking amplifier segment 133 PA1_1 partitioned from a first peaking amplifier PA1, and the power splitter for splitting the input power signal to the second carrier amplifier segment 132 CA_2 and the first peaking amplifier segment 133 PA1_1 separately; and the third path 138 comprises a second peaking amplifier segment 134 PA1_2 partitioned from the first peaking amplifier PA1 and a second peaking amplifier 135 PA2, and the power splitter for splitting the input power signal to the second peaking amplifier segment 134 PA1_2 and the second peaking amplifier 135 PA2 separately. The first path 136 is configured for performance optimization at a low power region and a first peak efficiency point; the second path 137 is configured for performance optimization at a medium power region and a second peak efficiency point; and the third path 138 is configured for performance optimization at a high power region and a third peak efficiency point.

In this embodiment, at the output, the impedance inverting network firstly combines the output signal power of the carrier amplifier segments CA_1 and CA_2 and the output signal power the first peaking amplifier segments PA1_1 and PA1_2 at the input of the Doherty impedance inverter 87b, which is consisted of two series-connected quarter-wave transformation lines in this embodiment. And the combined output signal power of the carrier amplifier and the first peaking amplifier is then combined with the output signal power of the second peaking amplifier PA2 at the output of the Doherty impedance inverter 87b.

In the embodiment, the partition of the carrier amplifier is implemented based on following division equations: $CA:PA1:PA2=1:n:m$; $K1=(1+n)/(1+n+m)$; $K2=1/(1+n)$; $CA\_1=K2/K1$; $CA\_2=1-K2/K1$; and the partition of the first peaking amplifier PA1 is implemented based on following division equations: $PA1\_1=K1/K2-1$ and $PA1\_2=n+1-K1/K2$; where n is a ratio between maximum power ratings of the carrier amplifier CA and the first peaking amplifier PA1; m is a ratio between maximum power ratings of the carrier amplifier CA and the second peaking amplifier PA2; K1 and K2 are back-off design parameters.

Similarly, FIG. 14 shows a further partitioned architecture corresponding to FIG. 12. In particular, the improved architecture shown in FIG. 14 also includes three components: three paths for amplifying input power signals from a signal preparation unit; the signal preparation unit for generating separately input power signals supplied to individual paths; and an impedance inverting network for combining output signal power of the paths.

In the embodiment, the first path comprises a first carrier amplifier segment CA_1 partitioned from the carrier amplifier CA. The second path comprises a second carrier amplifier segment CA_2 partitioned from the carrier amplifier CA and a first peaking amplifier segment PA1_1 partitioned from a first peaking amplifier PA1, and the power splitter for splitting the input power signal to the second carrier amplifier segment CA_2 and the first peaking amplifier segment PA1_1 separately. The third path comprises a third carrier amplifier segment CA_3 partitioned from the carrier amplifier, a second peaking amplifier segment PA1_2 partitioned from the first peaking amplifier PA1 and a second peaking amplifier PA2, and the power splitter for splitting the input power signal to the third carrier amplifier segment CA_3, the second peaking amplifier segment PA1_2 and the second peaking amplifier PA2 separately.

The first path is configured for performance optimization at a low power region and a first peak efficiency point. The second path is configured for performance optimization at a medium power region and a second peak efficiency point. The third path is configured for performance optimization at a high power region and a third peak efficiency point.

In this embodiment, the signal preparation unit is similar to the one used in FIG. 13(a), thus will be omitted here.

In this embodiment, at the output, the impedance inverting network firstly combines the output signal power of the carrier amplifier segments CA_1, CA_2 and CA_3 and the output signal power of the first peaking amplifier segments PA1_1 and PA1_2 at the input of the Doherty impedance inverter 87b; which is consisted of three connected quarter-wave transformation lines in this embodiment. And the combined output signal power of the carrier amplifier and the first peaking amplifier is then combined with the output signal power of the second peaking amplifier PA2 at the output of the Doherty impedance inverter 87b.

In the embodiment, the partition of the carrier amplifier is implemented based on following division equations: $CA:PA1:PA2=1:n:m$; $K1=n/(n+m)$; $K2=1/(1+n+m)$; $CA\_1=K2$; $CA\_2=K1-K2$; $CA\_3=1-K1$; and the partition of the first peaking amplifier PA1 is implemented based on following division equations: $PA1\_1=K1(K1/K2-1)$ and $PA1\_2=n-K1/(K1/K2-1)$; where n is a ratio between maximum power ratings of the carrier amplifier CA and the first peaking amplifier PA1; m is a ratio between maximum power ratings of the carrier amplifier CA and the second peaking amplifier PA2; K1 and K2 are back-off design parameters.

As shown in FIGS. 13(a) and 14, CA_1 is the only device biased in Class-AB for maximizing the performance of DPA in low power region. When CA_1 reaches to saturated operation, CA_2 and PA1_1 biased at the same Class-C or Class-B point are turned on for maintaining high efficiency in Doherty region1. Thus the three-way DPA's performance may be further improved, at the cost of increased circuit complexities for triple-input digitally driven signals. In this way, CA_1 does not need impedance inverting as that in the present two-way DPA in FIG. 8(a), and the remaining amplifier cells only have two impedance states, the one is the high impedance (open circuit) in the off-state, and the other is the optimum power matching impedance for maximum power and efficiency when they are turned-on. As a consequence, in the new DPA architecture as shown in FIG. 13(a), the offset lines may be added in each power amplifier cells as in FIG. 10, so as to optimize the two state impedances simultaneously, and the design of each power amplifier cell for maximizing the performance of the whole DPA becomes much easier with enhanced efficiency, linearity, power, bandwidths, etc. Besides, the presented improved Doherty configurations and the associating systematic design methods can be also extended to multi-way (N-way, N>3) realizations.

Figure 15:
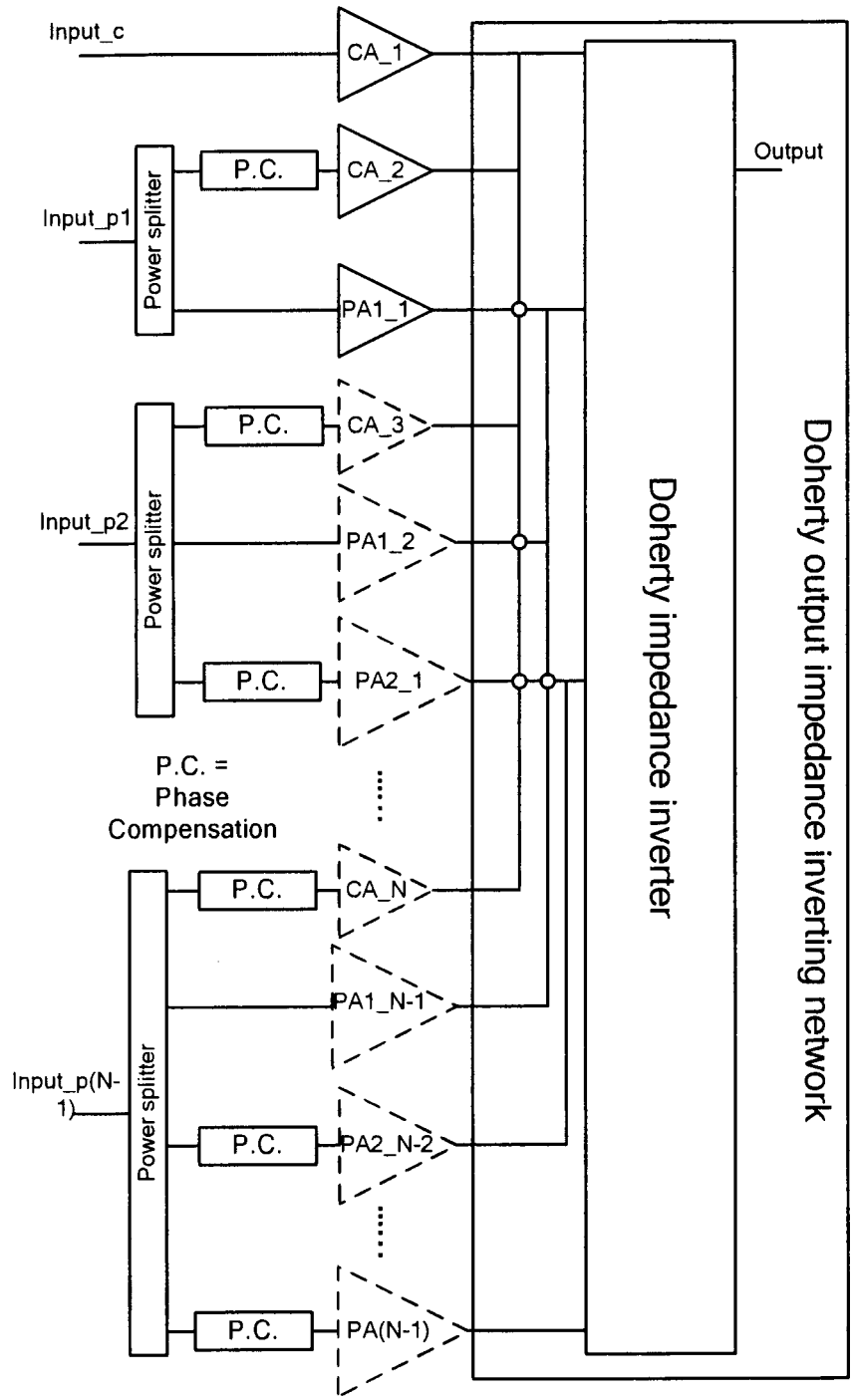
FIG. 15 illustrates a schematic diagram of an architecture for a multi-input and multi-way DPA according to an embodiment of the present invention.

The improved DPA configuration may be also extended to the multi-way realizations. According to a further embodiment of the present invention, FIG. 15 shows a general multi-input and multi-way DPA. Initially, only CA_1 biased in Class-B or Class-AB works for the low power region, and it comes to power saturation and maximum efficiency at the first peak efficiency point. Unlike the carrier amplifier in the conventional DPA, there is no output impedance transformation for CA_1, and it only has one impedance state. Then the remaining carrier and peaking amplifier cells in different paths are turned on sequentially according to the input power level.

Since the carrier and peaking amplifier cells sharing the same input signal path are biased at the same Class-C or Class-B point below pinch-off, they will be turned on simultaneously, and the simple analog input power splitters can be used without influencing the performance of the DPA. Besides, the transmission lines for phase compensation can be added at the input of these amplifiers depending on their phase difference within each path. Moreover, by partitioning the carrier and peaking amplifiers to different segments, all of the amplifiers cells except for CA_1 only have two impedance states, the one is the high impedance (open circuit) at off-state, and the other is the optimum power matching impedance for maximum power and efficiency.

In the various multi-way (including two-way, three-way) DPA architectures, both the CA and PAs may have more than two impedance states. According to the partition principle of the present invention, some of them need to be partitioned to different segments with impedance states not more than two. This also means that the amplifier segments will amplify the input signal for not more than two power regions. In other words, when the amplifier cells in the same path are amplifying the input signal, the remaining amplifier segments in other paths will keep either the maximum saturation output power or in the off-state with no output power. Moreover, at the output of these amplifier segments, they will be power combined at the input of the Doherty impedance inverter firstly, so as to perform the same power capability and operation in the original DPA without amplifier partition. Then the carrier and peaking amplifiers are power combined at the output of the Doherty impedance inverter. Besides, now the impedance states seen from the output of the power combined points will be also kept the same as in the original CA and PAs. However, the enhanced DPA performance may be expected with independently controlled and optimized amplification paths.

Figure 13B:
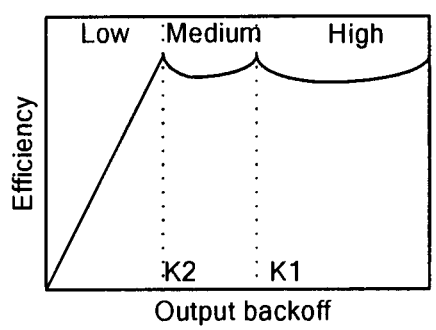
Figure 16:
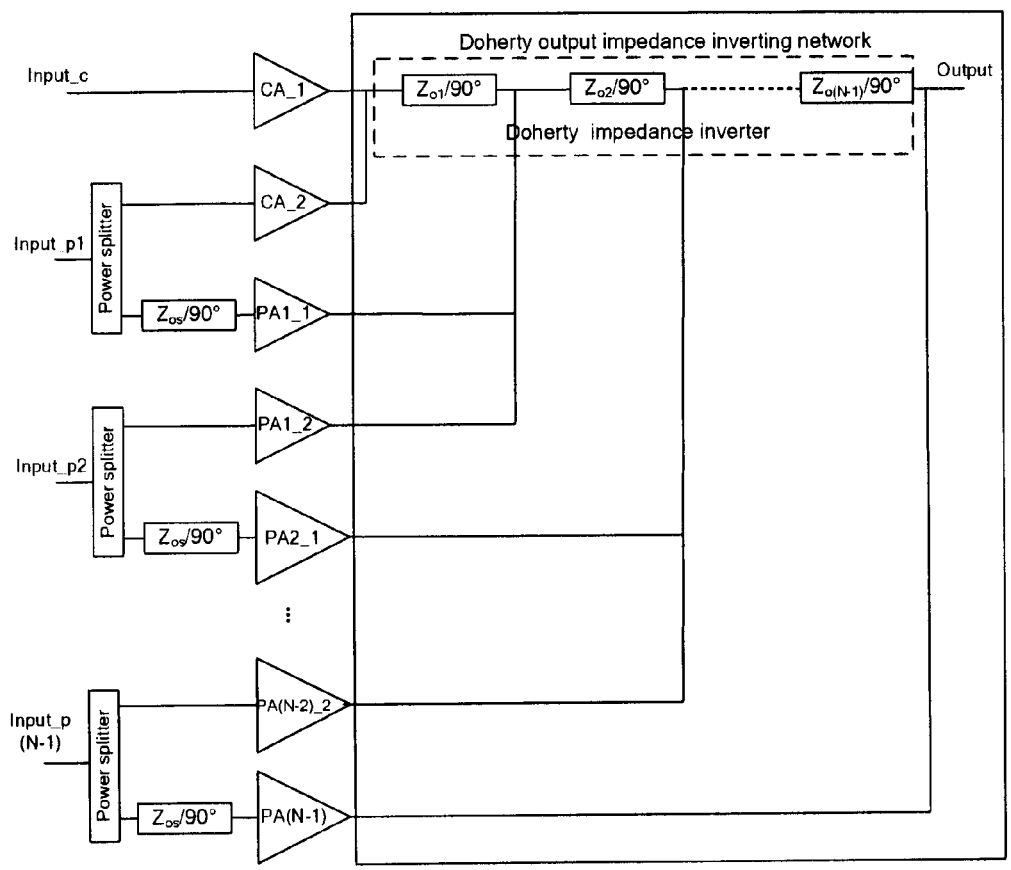
FIG. 16 illustrates a schematic diagram of an architecture for a multi-input and multi-way DPA according to an embodiment of the present invention.

FIG. 16 shows a particular improved multi-way DPA architecture according to a further embodiment of the present invention, which is also a multi-way DPA extension from FIG. 13 (a). Herein, the multi-way DPA shown in FIG. 16 includes N paths for amplifying input power signals from a signal preparation unit; the signal preparation unit for generating separately input power signals supplied to individual N paths; and an impedance inverting network for combining output signal power of the N paths. Since in the conventional multi-way DPA configuration extended from FIG. 3(a), the carrier and peaking amplifiers have at most three steady impedance states, which only need to be partitioned once to two amplifier segments with impedance states not more than two.

The first path is a first carrier amplifier segment CA_1 partitioned from the carrier amplifier; the second path comprises a second carrier amplifier segment CA_2 partitioned from the carrier amplifier and a first peaking amplifier segment PA1_1 partitioned from a first peaking amplifier PA1; the third path comprises at least a second peaking amplifier segment PA1_2 partitioned from the first peaking amplifier PA1 and a first peaking amplifier segment PA2_1 partitioned from a second peaking amplifier PA2; a x-th path comprises at least a second peaking amplifier segment PA(x−2)_2 partitioned from the (x−2)-th peaking amplifier, and a first peaking amplifier segment PA(x−1)_1 partitioned from a (x−1)-th peaking amplifier PA(x−1), (3<x<N); and a N-th path comprises at least a second peaking amplifier segment PA(N−2)_2 partitioned from the (N−2)-th peaking amplifier, and a (N−1)-th peaking amplifier PA(N−1).

The first path is configured for performance optimization at a low power region and a first peak efficiency point; the second path is configured for performance optimization at a first medium power region and a second peak efficiency point; the third path is configured for performance optimization at a second medium power region and a third peak efficiency point; and the x-th path is configured for performance optimization at a (x−1)-th medium power region and a x-th peak efficiency point; and the N-th path is configured for performance optimization at a high power region and a N-th peak efficiency point.

In this embodiment, the signal preparation unit outputs N individual power signals to the corresponding N paths, and will not be described in detail again since it is similar with the one for the two-way DPA of the invention shown in FIG. 9 except outputting N individual power signals rather than two.

Similarly as above, at the output, the impedance inverting network combines output signal power of the carrier amplifier segments at an input of the Doherty impedance inverter; combines output signal power of the plurality of peaking amplifier segments at an input of the Doherty impedance inverter; and combining output signal power of all the segments and undivided (N−1)-th peaking amplifier at an output of the Doherty impedance inverter. The Doherty impedance inverter is a (N−1) number of series-connected quarter-wave lines in this embodiment.

Some exemplary embodiments as described above are employed to illustrate/explain the invention. It is to be noted that features in one embodiment may be suitable for other embodiments as appropriately.

In the context of various embodiments of the invention, the term "impedance state" generally refers to a steady impedance state, which means the output impedance value of each amplifier cell at the power level when the DPA achieves one of its peak efficiency points. Similarly, the term "a power region" includes the power levels in-between two efficiency points of the DPA. Thus at each peak efficiency point, each amplifier will have an impedance state. In this invention, the CA and PA(s) are partitioned with various CA and PA segments so that each segment has not more than two steady impedance states. Moreover, as to the amplifier segments in the paths which are not turned on in the low power region at the beginning, their initial impedance state is very high impedance near to open circuit in the off-state, and the other impedance state is the power matching impedance when they are turned on.

Once the desired operating characteristics such as power and efficiency performance are determined, the DPA architecture for carrier and peaking amplifiers may be determined. In the invention, in general, the carrier and peaking amplifiers will be partitioned to dedicated segments according to their impedance states and operational power ranges. Then these carrier and peaking amplifier cells containing segments or an undivided carrier amplifier or peaking amplifier may be determined and optimized separately according to their operating power region and efficiency requirements.

As to the input signal considerations, the adaptive phase and amplitude alignment is guaranteed by the two-input DPA structure with signal pre-processing using either digital or analogue method. The signal supplied to each path from the signal preparation unit is clipped and removed in a power level corresponding to a peak efficiency point so as not to overdrive the amplifier segments in each path.

It is to be noted that, in the invention, the undivided carrier amplifier and undivided peaking amplifiers may also be implemented as multi-stage amplifiers working in series and/or a plurality of amplifiers working in parallel; and each of them may also be partitioned into segments according to the principle of the invention.

Figure 17:
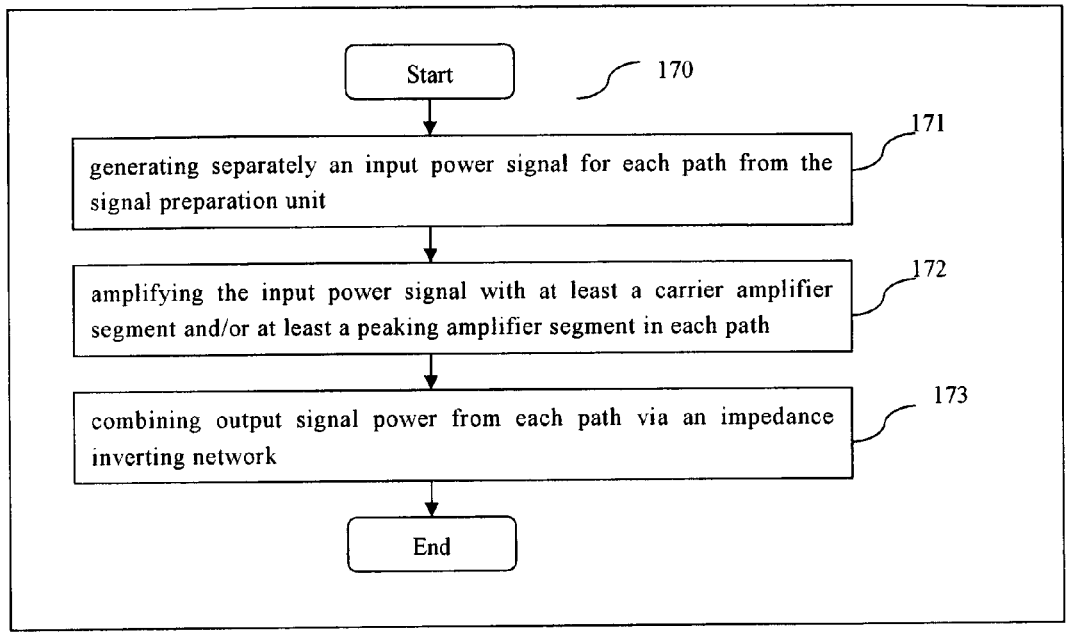
FIG. 17 illustrates a flowchart of a method for power amplifying with the DPA according to an embodiment of the present invention.

FIG. 17 illustrates a method 170 for power amplifying by DPA according to the embodiments of the invention as described above. The method 170 includes generating separately an input power signal for each path from the signal preparation unit 171; amplifying the input power signal with at least a carrier amplifier segment and/or at least a peaking amplifier segment in each path 172; and combining output signal power from each path via an impedance inverting network 173. Preferably, the combining further includes combining output signal power from each carrier amplifier segment; and combining output signal power from each peaking amplifier segment firstly. It is to be noted to an ordinary skilled in the art that all those features suitable for the improved architecture of DPA of the invention are also correspondingly applied to the method according to the embodiments of the invention. For clarity and concise purpose, all those details of the features or functions will be omitted here.

In conclusion, compared with the existing solutions, the advantages of some embodiments are as follows from the viewpoints of circuit performance and implementation. Better co-operation of carrier and peaking amplifiers for performance enhancement may be achieved. Higher efficiency for high back-off power range and higher average efficiency may be achieved without compromises being made for the overall power range. Higher working bandwidth may be provided without the need of offset lines for carrier amplifier. Optimum 3-way and multi-way DPA extensions may be made with the insertion of offset lines method. Further, improved VBW and heat dissipation will be achieved due to smaller carrier amplifier segment used; and a better linearity and power gain performance can be expected.

Figure 18:
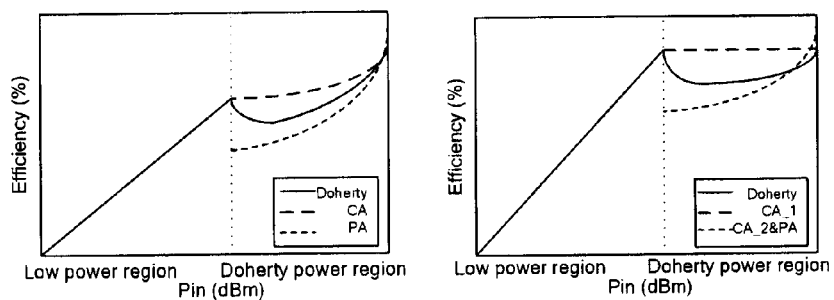
FIG. 18 illustrates efficiency comparison plot between a conventional 2-way DPA and the 2-way DPA according to the embodiment of the invention.

From the theoretical efficiency plot of the improved dual-input digitally driven DPA of the invention, its performance may be enhanced compared to prior arts, see FIG. 18 where the left plot depicts the efficiency with the conventional DPA and the right one is the efficiency with the improved DPA of the present invention. Because in the new Doherty architectures, the efficiency for different power states can be optimized independently with corresponding amplifier cells, whereas in original configuration the carrier and peaking amplifier design often influences with each other, resulting in performance degradation.

From the implementation point of view, independent amplifier cells design may be implemented for optimized performance without trade-offs made for each other. Easier (Faster) design/tuning is provided for targeted performance. Less sensitive (lower risk) to circuit component variations is achieved. Thus, the invention may provide improved DPAs with higher yield, consistency, stability, and reliability. Further, the DPA performance may be monitored in an easier way.

Herein, "Easier (faster) design/tuning for targeted performance" means the amplifier cells design is now relatively independent to each other with proper input signal control and offset line tuning for high off-state impedance. "Less sensitive to circuit component variation" and "higher consistency, stability" mean that now specific segmented amplifier cells take responsibility for the DPA performance in dedicated power regions, so the whole DPA performance may in-turn reflect working operation of each amplifier cell, and thus it is "easier to monitor DPA performance".

It is to be noted that, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate. Further, it is to be noted that, the order of features/steps in the claims or in the description do not imply any specific order in which the features/steps must be worked. Rather, the steps/features may be performed in any suitable order.

The elements and components of an embodiment of the invention may be physically, functionally and logically implemented in any suitable way. Indeed, the functionality may be implemented in a single unit, in a plurality of units or as part of other functional units. As such, the invention may be implemented in a single unit, or may be physically and/or functionally distributed between different units and processors.

The terminology used herein is for the purpose of describing particular embodiments only and is not intended to limit to the invention. As used herein, the singular forms "a", "an" and "the" are intended to comprise the plural forms as well, unless otherwise stated. It will be further understood that the terms "including", "comprising" and conjugation thereof when used herein, specify the presence of stated features, integers, steps, operations, elements, and/or components, but do not preclude the presence or addition of one or more other features, integers, steps, operations, elements, components, and/or groups thereof.

Although the invention has been particularly shown and described with reference to exemplary embodiments thereof, it will be understood by those skilled in the art that various changes in form and details may be made without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims.

The invention claimed is:

1. A multi-way Doherty power amplifier, DPA, comprising:
   a first path comprising a carrier amplifier and a first carrier amplifier segment CA 1 partitioned from the carrier amplifier, the first path configured for performance optimization at a low power region and a first peak efficiency point;
   a second path comprising a second carrier amplifier segment CA 2 partitioned from the carrier amplifier and a first peaking amplifier PA1, the second path being configured for performance optimization at a high power region and at a second peak efficiency point;
   a power splitter for splitting an input power signal to the second carrier amplifier segment CA 2 and the first peaking amplifier PA1 separately;
   a signal preparation unit configured for generating separately input power signal for the first path and each of the second path, and configured for adaptively aligning phases of signals in the first path and in the second path; and
   an impedance inverting network configured for combining output signal power from each path.

2. The multi-way Doherty power amplifier, DPA, of claim 1, wherein the impedance inverting network is further configured for:
   combining output signal power from each carrier amplifier segment and the carrier amplifier;
   combining output signal power from each peaking amplifier segment and the peaking amplifier.

3. The multi-way Doherty power amplifier, DPA, of claim 1, wherein:
   the multi-way DPA is a N-way DPA, N>3;
   the second path is configured for performance optimization at a first medium power region and a second peak efficiency point;
   a third path comprises at least a second peaking amplifier segment PA1_2 partitioned from the first peaking amplifier PA1 and a first peaking amplifier segment PA2_1 partitioned from a second peaking amplifier PA2, and is configured for performance optimization at a second medium power region and a third peak efficiency point;
   a x-th path comprises at least a second peaking amplifier segment PA(x−2)_2 partitioned from the (x−2)-th peaking amplifier, and a first peaking amplifier segment PA(x−1)_1 partitioned from a (x−1)-th peaking amplifier PA(x−1), (3<x<N); and the x-th path is configured for performance optimization at a (x−1)-th medium power region and a x-th peak efficiency point; and
   a N-th path comprises at least a second peaking amplifier segment PA(N−2)_2 partitioned from the (N−2)-th peaking amplifier, and a (N−1)-th peaking amplifier PA(N−1); and the N-th path is configured for performance optimization at a high power region and a N-th peak efficiency point.

4. The multi-way Doherty power amplifier, DPA, of claim 3, wherein:
   there is no output impedance transformation for the first carrier amplifier segment CA 1 biased at one of Class-AB and Class-B point in the first path which only has one steady impedance state; and
   the N paths with different input power signals are turned on sequentially according to input power levels.

5. The multi-way Doherty power amplifier, DPA, of claim 4, wherein at least one of each segment and the first peaking amplifier PA1 contained in a same path from the second path to the N-th path are biased at the same one of Class-C and Class-B point under pinch-off, and are turned on and saturated simultaneously.

6. The multi-way Doherty power amplifier, DPA, of claim 3, wherein the signal preparation unit is further configured to:
   clip a first peak level signal of the input power signal to generate a first input power signal for the first path;
   clip a second peak level signal of the input power signal and remove a signal less than a first peak level to generate a second input power signal for the second path;
   clip a x-th peak level signal of the input power signal and remove a signal less than a (x−1)-th peak level to generate a x-th input power signal for the x-th path; and
   remove a signal less than a N-th peak level from the input power signal to generate a N-th input power signal for the N-th path.

7. The multi-way Doherty power amplifier, DPA, of claim 6, wherein a peak level is set as a power level at which the carrier amplifier segment and the peaking amplifier segment in one path saturate simultaneously.

8. The multi-way Doherty power amplifier, DPA, of claim 1, wherein the partition of the carrier amplifier is based on division equations:

$$CA:PA=1:n,\ CA\_1=1/(1+n)=K,\ \text{and}\ CA\_2=n/(1+n)=1-K,$$

where n is a ratio of maximum power ratings between the carrier amplifier CA and the peaking amplifier PA, K is a back-off design parameter.

9. The multi-way Doherty power amplifier, DPA, of claim 1, wherein the CA_1 is biased at one of Class-B and Class-AB point, whereas the CA_2 and the PA are biased at the same one of Class-C and Class-B point.

10. The multi-way Doherty power amplifier, DPA, of claim 1, wherein:
    at a low power region, only the CA_1 is working; and
    the CA_2 and the PA are turned on simultaneously at a high power region whereas the CA_1 is saturated.

11. The multi-way Doherty power amplifier, DPA, of claim 1, wherein the multi-way DPA is a three-way DPA comprising the first path, the second path and a third path, wherein:
    the second path is configured for performance optimization at a medium power region; and
    a third path comprises a second peaking amplifier segment PA1_2 partitioned from the first peaking amplifier PA1 and a second peaking amplifier PA2, and the power splitter for splitting the input power signal to the second peaking amplifier segment PA1_2 and the second peaking amplifier PA2 separately; and the third path is configured for performance optimization at a high power region and a third peak efficiency point.

12. The multi-way Doherty power amplifier, DPA, of claim 11, wherein the partition of the carrier amplifier is based on following division equations:

$$CA:PA1:PA2=1:n:m,\ K1=(1+n)/(1+n+m), K2=1/(1+n),$$

$$CA\_1=K2/K1,\ CA\_2=1-K2/K1;\ \text{and}$$

the partition of the first peaking amplifier PA1 is based on following division equations:

$$PA1\_1=K1/K2-1\ \text{and}\ PA1\_2=n+1-K1/K2;\ \text{wherein}$$

n is a ratio between maximum power ratings of the carrier amplifier CA and the first peaking amplifier PA1; m is a ratio between maximum power ratings of the carrier amplifier CA and the second peaking amplifier PA2; K1 and K2 are back-off design parameters.

13. The multi-way Doherty power amplifier, DPA, of claim 1, wherein:
the multi-way DPA is a three-way DPA comprising the first path, the second path and a third path;
the second path is configured for performance optimization at a medium power region and
a third path comprises a third carrier amplifier segment CA_3 partitioned from the carrier amplifier, a second peaking amplifier segment PA1_2 partitioned from the first peaking amplifier PA1 and a second peaking amplifier PA2, and the power splitter for splitting the input power signal to the third carrier amplifier segment CA_3, the second peaking amplifier segment PA1_2 and the second peaking amplifier PA2 separately; and the third path is configured for performance optimization at a high power region and a third peak efficiency point.

14. The multi-way Doherty power amplifier, DPA, of claim 13, wherein the partition of the carrier amplifier is based on following division equations:

$$CA:PA1:PA2=1:n:m,\ K1=n/(n+m),\ K2=1/(1+n+m),$$

$$CA\_1=K2,\ CA\_2=K1-K2,\ CA\_3=1-K1;\ \text{and}$$

the partition of the first peaking amplifier PA1 is based on following division equations:

$$PA1\_1=K1(K1/K2-1)\ \text{and}\ PA1\_2=n-K1/(K1/K2-1);$$
wherein n is a ratio between maximum power ratings of the carrier amplifier CA and the first peaking amplifier PA1; m is a ratio between maximum power ratings of the carrier amplifier CA and the second peaking amplifier PA2; K1 and K2 are back-off design parameters.

15. The multi-way Doherty power amplifier, DPA, of claim 11, wherein:
the first carrier amplifier segment CA_1 in the first path is biased at one of Class-B and Class-AB point; and
at least one of each segment and the second peaking amplifier PA2 in the same other path are biased at the same one of Class-C and Class-B point.

16. The multi-way Doherty power amplifier, DPA, of claim 11, wherein:
at a low power region, only the first carrier amplifier segment CA_1 is working;
the segments in the second path are turned on simultaneously at a first medium power region whereas the CA_1 is saturated; and
the segments and PA2 in the third path are turned on simultaneously at a high power region whereas the segments in the second path are saturated simultaneously.

17. The multi-way Doherty power amplifier, DPA, of claim 1, wherein the multi-way DPA is a three-way DPA comprising the first path and the second path, wherein:
the first path is configured for performance optimization at first two power regions and first two peak efficiency points; and
the second path is configured for performance optimization at a high power region and a third peak efficiency point.

18. The multi-way Doherty power amplifier, DPA, of claim 17, wherein the partition of the first peaking amplifier PA1 is based on following division equations:

$$CA:PA1:PA2=1:n:m,\ K1=(1+n)/(1+n+m),K2=1/(1+n),\ \text{and}$$

$$PA1\_1=K1/K2-1\ \text{and}\ PA1\_2=n+1-K1/K2;\ \text{wherein}$$

n is a ratio between maximum power ratings of the carrier amplifier CA and the first peaking amplifier PA1; m is a ratio between maximum power ratings of the carrier amplifier CA and the second peaking amplifier PA2; K1 and K2 are back-off design parameters.

19. The multi-way Doherty power amplifier, DPA, of claim 1, wherein:
the multi-way DPA is a three-way DPA comprising the first path and the second path;
the first path is configured for performance optimization at first two power regions and first two peak efficiency points; and
the second path is configured for performance optimization at a high power region and a third peak efficiency point.

20. The multi-way Doherty power amplifier, DPA, of claim 19, wherein the partition of the carrier amplifier is based on following division equations:

$$CA:PA1:PA2=1:n:m,\ K1=n/(n+m),K2=1/(1+n+m),$$

$$CA\_1=K1,\ CA\_2=1-K1;\ \text{and}$$

the partition of the first peaking amplifier PA1 is based on following division equations:

$$PA1\_1=K1(K1/K2-1)\ \text{and}\ PA1\_2=n-K1/(K1/K2-1);$$
wherein n is a ratio between maximum power ratings of the carrier amplifier CA and the first peaking amplifier PA1; m is a ratio between maximum power ratings of the carrier amplifier CA and the second peaking amplifier PA2; K1 and K2 are back-off design parameters.

21. The multi-way Doherty power amplifier, DPA, of claim 17, wherein:
one of the carrier amplifier CA and the first carrier amplifier segment CA_1 in the first path is biased at one of Class-AB and Class-B point and the first peaking amplifier segment PA1_1 of the first peaking amplifier is biased at Class-C point; and
each segment and the second peaking amplifier PA2 in the second path is biased at the same one of Class-C and Class-B point.

22. The multi-way Doherty power amplifier, DPA, of claim 17, wherein:
at a low power region, only the carrier amplifier CA or the first carrier amplifier segment CA_1 in the first path is working;
the first peaking amplifier segment PA1_1 of the first peaking amplifier in the first path is turned on at a first medium power region whereas the one of CA and CA_1 is saturated but with impedance transform in-between two steady impedance states and works together with the PA1_1 at the first medium power region; and
the segments and PA2 in the second path are turned on simultaneously at a high power region whereas the one of CA and CA_1 and PA1_1 both come to saturation and maximum output power simultaneously.

23. The multi-way Doherty power amplifier, DPA, of claim 1, wherein the signal preparation unit adaptively aligns the phases for all power levels after the peaking amplifier is turned on.

24. A method for power amplifying by Doherty Power Amplifier, DPA, the DPA comprising:
a first path comprising a carrier amplifier and a first carrier amplifier segment CA 1 partitioned from the carrier amplifier, the first path being configured for performance optimization at a low power region and a first peak efficiency point;
a second path comprising a second carrier amplifier segment CA2 partitioned from the carrier amplifier and a first peaking amplifier PA1, the second path being configured for performance optimization at a high power region and at a second peak efficiency point;

a power splitter for splitting an input power signal to the second carrier amplifier segment CA 2 and the first peaking amplifier PA1 separately;

a signal preparation unit configured for generating separately input power signal for the first path and the second path, and configured for adaptively aligning phases of signals in the first path and in the second path; and an impedance inverting network configured for combining output signal power from each path, the method comprising:

generating separately an input power signal for each path from the signal preparation unit;

amplifying the input power signal with at least one of at least a carrier amplifier segment and at least a peaking amplifier segment in each path; and combining output signal power from each path via an impedance inverting network.

25. The method of claim 24, wherein the combining step further comprises:

combining output signal power from each carrier amplifier segment; and combining output signal power from each peaking amplifier segment.

26. The method of claim 24, wherein the signal preparation unit adaptively aligns the phases for all power levels after the peaking amplifier is turned on.

\* \* \* \* \*